(12) United States Patent
Higuchi et al.

(10) Patent No.: US 11,145,516 B2
(45) Date of Patent: Oct. 12, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Ayumi Higuchi, Kyoto (JP); Yuya Akanishi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/687,697

(22) Filed: Nov. 19, 2019

(65) Prior Publication Data

US 2020/0168467 A1    May 28, 2020

(30) Foreign Application Priority Data

Nov. 26, 2018  (JP) .............................. JP2018-220727

(51) Int. Cl.
*H01L 21/306*      (2006.01)
*H01L 21/67*       (2006.01)

(52) U.S. Cl.
CPC .. *H01L 21/30604* (2013.01); *H01L 21/67069* (2013.01)

(58) Field of Classification Search
None
See application file for complete search history.

(56) References Cited

U.S. PATENT DOCUMENTS

| 2005/0056616 | A1  | 3/2005  | Cooper et al. |
| 2010/0015805 | A1  | 1/2010  | Mayer et al. |
| 2011/0266676 | A1  | 11/2011 | Isobayashi |
| 2018/0337117 | A1* | 11/2018 | Nishihara ........... H01L 21/4857 |
| 2019/0097041 | A1  | 3/2019  | Ohtani |

* cited by examiner

*Primary Examiner* — Roberts P Culbert
(74) *Attorney, Agent, or Firm* — JCIPRNET

(57) ABSTRACT

A substrate processing method processes a substrate having a surface in which a plurality of recessed parts is formed. The substrate processing method includes a processing target layer removing process of etching and removing at least a part of a processing target layer by supplying an etching solution, of which an etching rate for a crystal grain of a processing target material in the processing target layer formed in the recessed part in a manner of a surface thereof is exposed is equal to an etching rate for a crystal grain boundary in the processing target layer, to the surface of the substrate.

15 Claims, 26 Drawing Sheets

SUBSTRATE PROCESSING METHOD AND SUBSTRATE PROCESSING APPARATUS

CROSS REFERENCE TO RELATED APPLICATION

Priority is claimed on Japanese Patent Application No. 2018-220727, filed Nov. 26, 2018, the content of which is incorporated herein by reference.

BACKGROUND

Technical Field

The present disclosure relates to a substrate processing method and a substrate processing apparatus which process a substrate. Processing target substrates include, for example, a semiconductor wafer, a substrate for a liquid crystal display, a substrate for a flat panel display (FPD) such as an organic electroluminescence (EL) display device, a substrate for an optical disc, a substrate for a magnetic disk, a substrate for a magneto-optical disc, a substrate for a photomask, a ceramic substrate, a substrate for a solar cell, and the like.

Description of Related Art

In a front end process (FEOL: front end of the line) of a manufacturing process of a semiconductor device or the like, a polysilicon layer is formed on a surface of a semiconductor wafer. In a back end process (BEOL: back end of the line) following the FEOL, a multi-layered metal layer is formed on the surface of the semiconductor wafer.

The polysilicon layer or the metal layer may be formed in a recessed part which is present in a surface of a substrate. Forming a polysilicon layer by, for example, growing a crystal in a recessed part through a chemical vapor deposition (CVD) method is known (refer to the specification of US Patent Application Publication No. 2019/097041). Forming a metal layer by, for example, forming a seed layer in the recessed part with a technique such as sputtering and then growing a crystal through an electroplating technique or the like is also known (refer to the specification of US Patent Application Publication No. 2011/266676).

The polysilicon layer or the metal layer formed in the recessed part by crystal growth is etched and removed from the recessed part as necessary. The metal layer is changed into a metal oxide layer by an oxidizing fluid or the like and then etched and removed from the recessed part. The polysilicon layer and the metal oxide layer (which may hereinafter be referred to as a "processing target layer") are preferably removed uniformly over the entire surface of the substrate by etching, but when the recessed parts having different widths are present in the surface of the substrate, an etching rate of the processing target layer may differ according to a width of each of the recessed parts. Therefore, the etching rate may not be uniform over the entire surface of the substrate, and an etching amount of the processing target layer may vary within the surface of the substrate.

Therefore, the present disclosure provides a substrate processing method and a substrate processing apparatus capable of removing a processing target layer on a surface of a substrate without variation.

SUMMARY

According to an embodiment, there is provided a substrate processing method which processes a substrate having a surface in which a plurality of recessed parts is formed, including a processing target layer removing process of etching and removing at least a part of a processing target layer by supplying an etching solution, of which an etching rate for a crystal grain of a processing target material in the processing target layer formed in the recessed part in a manner of a surface thereof is exposed is equal to an etching rate for a crystal grain boundary in the processing target layer, to the surface of the substrate.

According to the method, the etching solution of which the etching rate for the crystal grain and the etching rate for the crystal grain boundary are the same is supplied to the surface of the substrate. Therefore, even when a portion having a high density of the crystal grain boundary and a portion having a low density of the crystal grain boundary are present in the processing target layer, the processing target layer can be uniformly etched using the etching solution regardless of sparseness and denseness of the crystal grain boundary. Therefore, the processing target layer on the surface of the substrate can be removed without variation.

As an example in which unevenness in the sparseness and denseness of the crystal grain boundary occurs in the surface of the substrate, there is a case in which crystals are grown on the surface of the substrate in which the recessed parts having different widths are formed. The crystal grains are less likely to grow as the width of the recessed part is narrower, and are easier to grow as the width of the recessed part is wider. Therefore, as the width of the recessed part is smaller, it is easier to make smaller crystal grains, and as the width of the recessed part is wider, it is easier to make larger crystal grains. That is, as the width of the recessed part is narrower, the density of the crystal grain boundary is higher, and as the width of the recessed part is wider, the density of the crystal grain boundary is lower.

Thus, in the substrate having the surface in which the plurality of recessed parts having different widths is formed, when the processing target layer is formed by crystal growth, or when the processing target layer is formed by denaturalizing another layer formed by the crystal growth, the sparseness and denseness of the crystal grain boundaries may occur in the processing target layer. Therefore, when the etching solution of which the etching rate for the crystal grain and the etching rate for the crystal grain boundary are the same is used regardless of the density of the crystal grain boundary, the processing target layer can be uniformly removed from the plurality of recessed parts even when the plurality of recessed parts having different widths is present in the surface of the substrate.

In one embodiment of the present disclosure, the etching solution may mainly contain a compound having a size larger than a gap present in the crystal grain boundary as a reaction compound which reacts with the processing target material when the processing target layer is etched.

When a size of the reaction compound which reacts with the processing target material when the processing target layer is etched is not larger than the gap present in the crystal grain boundary, the reaction compound easily enters a space between atoms of the processing target material in the crystal grain boundary. Thus, when the etching solution which mainly contains a compound having a size equal to or smaller than the gap present in the crystal grain boundary is used as the reaction compound, the etching rate increases as the density of the crystal grain boundary of the processing target layer increases.

On the other hand, when the size of the reaction compound which reacts with the processing target material when the processing target layer is etched is larger than the gap present in the crystal grain boundary, the reaction compound is less likely to enter the gap present in the crystal grain boundary. Thus, when the etching solution which mainly contains a compound having a size larger than the gap present in the crystal grain boundary is used as a reaction compound, an increase in the etching rate can be suppressed even when the density of the crystal grain boundary of the processing target layer is high. Therefore, even when the plurality of recessed parts having different widths is present in the surface of the substrate, the processing target layer can be uniformly removed from the recessed parts. As a result, the processing target layer can be removed from the surface of the substrate without variation.

In one embodiment of the present disclosure, the substrate processing method may further include a processing target layer forming process of forming the processing target layer by supplying a denaturalization fluid on the surface of the substrate and denaturalizing a surface layer of a layer to be denaturalized which is formed in the recessed part in a manner of a surface thereof is exposed.

According to the method, the processing target layer formed by denaturalizing the surface layer of the layer to be denaturalized into the processing target layer is etched with the etching solution. Thus, even when etching accuracy is improved by denaturalizing the layer to be denaturalized into the processing target layer and then etching the processing target layer, the etching solution of which the etching rate for the crystal grain and the etching rate for the crystal grain boundary are the same can be used.

For example, in the substrate having the surface in which the plurality of recessed parts having different widths is formed, when the process target layer is formed by denaturalizing the layer to be denaturalized formed by crystal growth, the sparseness and denseness of the crystal grain boundaries generated in the layer to be denaturalized is inherited by the processing target layer. Therefore, when the etching solution of which the etching rate for the crystal grain and that for crystal grain boundary are the same is used, the processing target layer can be uniformly removed from the plurality of recessed parts even when the plurality of recessed parts having different widths is present in the surface of the substrate.

In one embodiment of the present disclosure, supply of the etching solution to the surface of the substrate in the processing target layer removing process may be started after supply of the denaturalization fluid to the surface of the substrate in the processing target layer forming process is stopped.

According to the method, the supply of the etching solution is started after the supply of the denaturalization fluid is stopped. Thus, an etching amount of the processing target layer can be easily controlled as compared with a case in which the supply of the denaturalization fluid and the supply of the etching solution are performed in parallel. As a result, it is possible to remove the processing target layer on the surface of the substrate without variation while precisely controlling the etching amount of the processing target layer.

In one embodiment of the present disclosure, the processing target layer forming process may include a process of forming the processing target layer composed of single atomic layers or several atomic layers by denaturalizing a surface layer of the layer to be denaturalized. Additionally, the processing target layer removing process may include a process of selectively removing the processing target layer from the surface of the substrate.

According to the method, in the processing target layer forming process, the processing target layer composed of single atomic layers or several atomic layers is formed. The etching amount of the processing target layer can be controlled in units of single atomic layers or several atomic layers by selectively removing the processing target layer in the processing target layer removing process. Therefore, even when the plurality of recessed parts having different widths is present in the surface of the substrate, the processing target layer can be uniformly removed from the recessed parts in units of atomic layers. As a result, the processing target layer can be removed from the surface of the substrate without variation.

In one embodiment of the present disclosure, the processing target layer forming process and the processing target layer removing process may be alternately performed a plurality of times. In the processing target layer forming process, when the processing target layer composed of single atomic layers or several atomic layers is formed, a thickness of the processing target layer to be etched by performing the processing target layer forming process and the processing target layer removing process once is substantially constant. Thus, a desired etching amount can be achieved while the processing target layer is removed from the surface of the substrate without variation by adjusting the number of times to repeatedly perform the processing target layer forming process and the processing target layer removing process.

In one embodiment of the present disclosure, supply of the etching solution to the surface of the substrate in the processing target layer removing process may be performed in parallel with supply of the denaturalization fluid to the surface of the substrate in the processing target layer forming process.

Accordingly, the processing target layer can be removed while the layer to be denaturalized is denaturalized into the process target layer. Therefore, as compared with the case in which the supply of the etching solution is started after the supply of the denaturalization fluid is stopped, the layer to be denaturalized can be removed quickly. As a result, the processing target layer can be removed from the surface of the substrate without variation while a time required for substrate processing is reduced.

In one embodiment of the present disclosure, the processing target layer forming process may include a metal oxide layer forming process of forming a metal oxide layer as the processing target layer by oxidizing a surface layer of the metal layer as the layer to be denaturalized with an oxidizing fluid as the denaturalization fluid. Additionally, the processing target layer removing process may include a metal oxide layer removing process of removing the metal oxide layer from the surface of the substrate with an acidic chemical solution as the etching solution.

According to the method, the metal oxide layer is formed by oxidizing the surface layer of the metal layer with the oxidizing fluid, and the metal oxide layer is removed with the acidic chemical solution. Therefore, even when the metal layer is exposed from the recessed part, the metal layer can be uniformly removed from the recessed part by removing the metal oxide layer with the etching solution after the metal oxide layer is formed by oxidizing the metal layer.

In one embodiment of the present disclosure, the acidic chemical solution may contain an organic acid.

In one embodiment of the present disclosure, the processing target layer removing process may include a polysilicon layer removing process of removing a surface layer of a polysilicon layer as the processing target layer from the surface of the substrate by supplying a basic chemical solution as the etching solution.

According to the method, at least a part of the polysilicon layer can be removed using the basic chemical solution. Even when the plurality of recessed parts having different widths is present in the surface of the substrate, the polysilicon layer can be uniformly removed from the plurality of recessed parts. As a result, the polysilicon layer can be removed from the surface of the substrate without variation.

In one embodiment of the present disclosure, the basic chemical solution may contain an organic alkali.

In one embodiment of the present disclosure, the substrate processing method may further include an etching solution type selection process of selecting a type of the etching solution supplied to the surface of the substrate in the processing target layer removing process from a plurality of types of etching solutions according to widths of the plurality of recessed parts so that the etching rate for the crystal grain is equal to the etching rate for the crystal grain boundary.

According to the method, the type of the etching solution supplied to the surface of the substrate in the processing target layer removing process is selected according to the widths of the plurality of recessed parts formed in the substrate so that the etching rate for the crystal grain and the etching rate for the crystal grain boundary are the same. That is, it is possible to select the type of the etching solution suitable for the substrate in the processing target layer removing process.

According to one embodiment of the present disclosure, there is provided a substrate processing method which processes a substrate having a surface in which a plurality of recessed parts is formed, including a processing target layer removing process of etching and removing at least a part of a processing target layer by supplying an etching solution having a constant etching rate for the processing target layer to the surface of the substrate regardless of a density of a crystal grain boundary of a processing target material in the processing target layer formed in the recessed part in a manner of a surface thereof is exposed.

According to the method, the etching solution having a constant etching rate for the processing target layer is supplied to the surface of the substrate regardless of the density of the crystal grain boundary. Thus, even when a portion having a high density of the crystal grain boundary and a portion having a low density of the crystal grain boundary are present in the processing target layer, the processing target layer can be uniformly etched using the etching solution regardless of the sparseness and denseness of the crystal grain boundary. Therefore, the processing target layer can be removed from the surface of the substrate without variation.

As described above, in the substrate having the surface in which the plurality of recessed parts having different widths is formed, when the processing target layer is formed by crystal growth, or when the processing target layer is formed by denaturalizing another layer formed by the crystal growth, the sparseness and denseness of the crystal grain boundaries may occur in the processing target layer. Therefore, when the etching solution of which the etching rate for the processing target layer is constant is used regardless of the density of the crystal grain boundary, the processing target layer can be uniformly removed from the plurality of recessed parts even when the plurality of recessed parts having different widths is present in the surface of the substrate.

According to one embodiment of the present disclosure, there is provided a substrate processing apparatus which processes a substrate having a surface in which a plurality of recessed parts is formed, including an etching solution supply unit configured to supply an etching solution, of which an etching rate for a crystal grain of a processing target material in a processing target layer formed in the recessed part in a manner of a surface thereof is exposed is equal to an etching rate for a crystal grain boundary in the processing target layer, to the surface of the substrate, and a controller configured to perform a processing target layer removing process of etching and removing at least a part of the processing target layer by supplying the etching solution to the surface of the substrate from the etching solution supply unit.

With such a configuration, the etching solution of which the etching rate for the crystal grain and the etching rate for the crystal grain boundary are the same is supplied to the surface of the substrate. Therefore, even when a portion having a high density of the crystal grain boundary and a portion having a low density of the crystal grain boundary are present in the processing target layer, the processing target layer can be uniformly etched using the etching solution regardless of the sparseness and denseness of the crystal grain boundary. Therefore, the processing target layer on the surface of the substrate can be removed without variation.

As described above, in the substrate having the surface in which the plurality of recessed parts having different widths is formed, when the processing target layer is formed by crystal growth, or when the processing target layer is formed by denaturalizing another layer formed by the crystal growth, the sparseness and denseness of the crystal grain boundaries may occur in the processing target layer. Therefore, when the etching solution of which the etching rate for the crystal grain and the etching rate for the crystal grain boundary are the same is used regardless of the density of the crystal grain boundary, the processing target layer can be uniformly removed from the plurality of recessed parts even when the plurality of recessed parts having different widths is present in the surface of the substrate.

In one embodiment of the present disclosure, the etching solution may mainly contain a compound having a size larger than a gap present in the crystal grain boundary as a reaction compound which reacts with the processing target material when the processing target layer is etched.

With such a configuration, the etching solution which mainly contains a reaction compound having a size larger than the gap present in the crystal grain boundary is used. Therefore, an increase in the etching rate can be suppressed even when the density of the crystal grain boundary of the processing target layer is high. Thus, even when the plurality of recessed parts having different widths is present in the surface of the substrate, the processing target layer can be uniformly removed from the recessed parts. As a result, the processing target layer can be removed on the surface of the substrate without variation.

In one embodiment of the present disclosure, the substrate processing apparatus may further include a denaturalization fluid supply unit configured to supply a denaturalization fluid, which forms the processing target layer by denaturalizing a layer to be denaturalized formed in the recessed part in a manner of a surface thereof is exposed, to the surface of the substrate. Additionally, the controller may perform a processing target layer forming process of forming the processing target layer by supplying the denaturalization fluid from the denaturalization fluid supply unit to the surface of the substrate and denaturalizing a surface layer of the layer to be denaturalized.

With such a configuration, the processing target layer formed by denaturalizing the surface layer of the layer to be denaturalized into the processing target layer is etched with the etching solution. Thus, even when etching accuracy is improved by denaturalizing the layer to be denaturalized into the processing target layer and then etching the processing target layer, the etching solution of which the etching rate for the crystal grain and the etching rate for the crystal grain boundary are the same can be used.

As described above, in the substrate having the surface in which the plurality of recessed parts having different widths is formed, when the process target layer is formed from the layer to be denaturalized formed by crystal growth, the sparseness and denseness of the crystal grain boundaries generated in the layer to be denaturalized is inherited by the processing target layer. Therefore, when the etching solution of which the etching rate for the crystal grain and that for crystal grain boundary are the same is used, the processing target layer can be uniformly removed from the plurality of recessed parts even when the plurality of recessed parts having different widths is present in the surface of the substrate.

In one embodiment of the present disclosure, the controller may start supply of the etching solution to the surface of the substrate in the processing target layer removing process after supply of the denaturalization fluid to the surface of the substrate in the processing target layer forming process is stopped.

With such a configuration, the supply of the etching solution is started after the supply of the denaturalization fluid is stopped. Thus, an etching amount of the processing target layer can be easily controlled as compared with a case in which the supply of the denaturalization fluid and the supply of the etching solution are performed in parallel. As a result, it is possible to remove the processing target layer on the surface of the substrate without variation while precisely controlling the etching amount of the processing target layer.

In one embodiment of the present disclosure, the controller may form the processing target layer composed of single atomic layers or several atomic layers by denaturalizing a surface layer of the layer to be denaturalized in the processing target layer forming process and may selectively remove the processing target layer from the surface of the substrate in the processing target layer removing process.

With such a configuration, in the processing target layer forming process, the processing target layer composed of single atomic layers or several atomic layers is formed. The etching amount of the processing target layer can be controlled in units of single atomic layers or several atomic layers by selectively removing the processing target layer in the processing target layer removing process. Therefore, even when the plurality of recessed parts having different widths is present in the surface of the substrate, the processing target layer can be uniformly removed from the recessed parts in units of atomic layers. As a result, the processing target layer can be removed from the surface of the substrate without variation.

In one embodiment of the present disclosure, the controller may alternately perform the processing target layer forming process and the processing target layer removing process a plurality of times. In the processing target layer forming process, when the processing target layer composed of single atomic layers or several atomic layers is formed, a thickness of the processing target layer to be etched by performing the processing target layer forming process and the processing target layer removing process once is substantially constant. Thus, a desired etching amount can be achieved while the processing target layer is removed from the surface of the substrate without variation by adjusting the number of times to repeatedly perform the processing target layer forming process and the processing target layer removing process.

In one embodiment of the present disclosure, the controller may perform supply of the etching solution to the surface of the substrate in the processing target layer removing process in parallel with supply of the denaturalization fluid to the surface of the substrate in the processing target layer forming process.

Accordingly, the processing target layer can be removed while the layer to be denaturalized is denaturalized into the process target layer. Therefore, as compared with the case in which the supply of the etching solution is started after the supply of the denaturalization fluid is stopped, the layer to be denaturalized can be removed quickly. As a result, the processing target layer can be removed from the surface of the substrate without variation while a time required for substrate processing is reduced.

In one embodiment of the present disclosure, the denaturalization fluid supply unit may include an oxidizing fluid supply unit configured to supply an oxidizing fluid as the denaturalization fluid to the surface of the substrate, and the etching solution supply unit may include an acidic chemical solution supply unit configured to supply an acidic chemical solution as the etching solution to the surface of the substrate With such a configuration, the metal oxide layer is formed by oxidizing the surface layer of the metal layer with the oxidizing fluid, and the metal oxide layer is removed with the acidic chemical solution. Therefore, even when the metal layer is exposed from the recessed part, the metal layer can be uniformly removed from the recessed part by removing the metal oxide layer with the etching solution after the metal oxide layer is formed by oxidizing the metal layer.

In one embodiment of the present disclosure, the acidic chemical solution may contain an organic acid.

In one embodiment of the present disclosure, the etching solution supply unit may include a basic chemical solution supply unit configured to supply a basic chemical solution as the etching solution, which removes a polysilicon layer as the processing target layer from the surface of the substrate, to the surface of the substrate.

With such a configuration, at least a part of the polysilicon layer can be removed using the basic chemical solution. Even when the plurality of recessed parts having different widths is present in the surface of the substrate, the polysilicon layer can be uniformly removed from the plurality of recessed parts. As a result, the polysilicon layer can be removed from the surface of the substrate without variation.

In one embodiment of the present disclosure, the basic chemical solution may contain an organic alkali.

In one embodiment of the present disclosure, the controller may perform an etching solution type selection process of selecting a type of the etching solution supplied to the surface of the substrate in the processing target layer removing process from a plurality of types of etching solutions according to widths of the plurality of recessed parts so that the etching rate for the crystal grain is equal to the etching rate for the crystal grain boundary.

With such a configuration, the type of the etching solution supplied to the surface of the substrate in the processing target layer removing process is selected according to the widths of the plurality of recessed parts formed in the substrate so that the etching rate for the crystal grain and the etching rate for the crystal grain boundary are the same. That is, it is possible to select the type of the etching solution suitable for the substrate in the processing target layer removing process.

According to one embodiment of the present disclosure, there is provided a substrate processing apparatus which processes a substrate having a surface in which a plurality of recessed parts is formed, including an etching solution supply unit configured to supply an etching solution having a constant etching rate for the processing target layer to the surface of the substrate regardless of a density of a crystal grain boundary of a processing target material in the processing target layer formed in the recessed part in a manner of a surface thereof is exposed, and a controller configured to perform a processing target layer removing process of etching and removing at least a part of the processing target layer by supplying the etching solution to the surface of the substrate from the etching solution supply unit.

According to the method, the etching solution having a constant etching rate for the processing target layer is supplied to the surface of the substrate regardless of the density of the crystal grain boundary. Thus, even when a portion having a high density of the crystal grain boundary and a portion having a low density of the crystal grain boundary are present in the processing target layer, the processing target layer can be uniformly etched using the etching solution regardless of the sparseness and denseness of the crystal grain boundary. Therefore, the processing target layer can be removed from the surface of the substrate without variation.

As described above, in the substrate having the surface in which the plurality of recessed parts having different widths is formed, when the processing target layer is formed by crystal growth, or when the processing target layer is formed by denaturalizing another layer formed by the crystal growth, the sparseness and denseness of the crystal grain boundaries may occur in the processing target layer. Therefore, when the etching solution of which the etching rate for the crystal grain and the etching rate for the crystal grain boundary are the same regardless of the density of the crystal grain boundary is used, the processing target layer can be uniformly removed from the plurality of recessed parts even when the plurality of recessed parts having different widths is present in the surface of the substrate.

The above-described or other objects, features, and effects of the present disclosure will be clarified by the following description of embodiments with reference to the accompanying drawings.

BRIEF DESCRIPTION OF THE DRAWINGS

FIG. 19 is a diagram showing a SEM image of a cross section in the vicinity of the surface of the substrate, after the oxidation of the copper wiring with the oxidizing fluid and the etching of the copper oxide layer with the acidic chemical solution are repeated, for each type of the acidic chemical solution.

FIG. 22 is a diagram showing a SEM image of a cross section in the vicinity of the surface of the substrate, after the copper wiring is etched with a mixed solution of the oxidizing fluid and the acidic chemical solution, for each type of the acidic chemical solution.

DESCRIPTION OF THE EMBODIMENTS

First Embodiment

Figure 1:
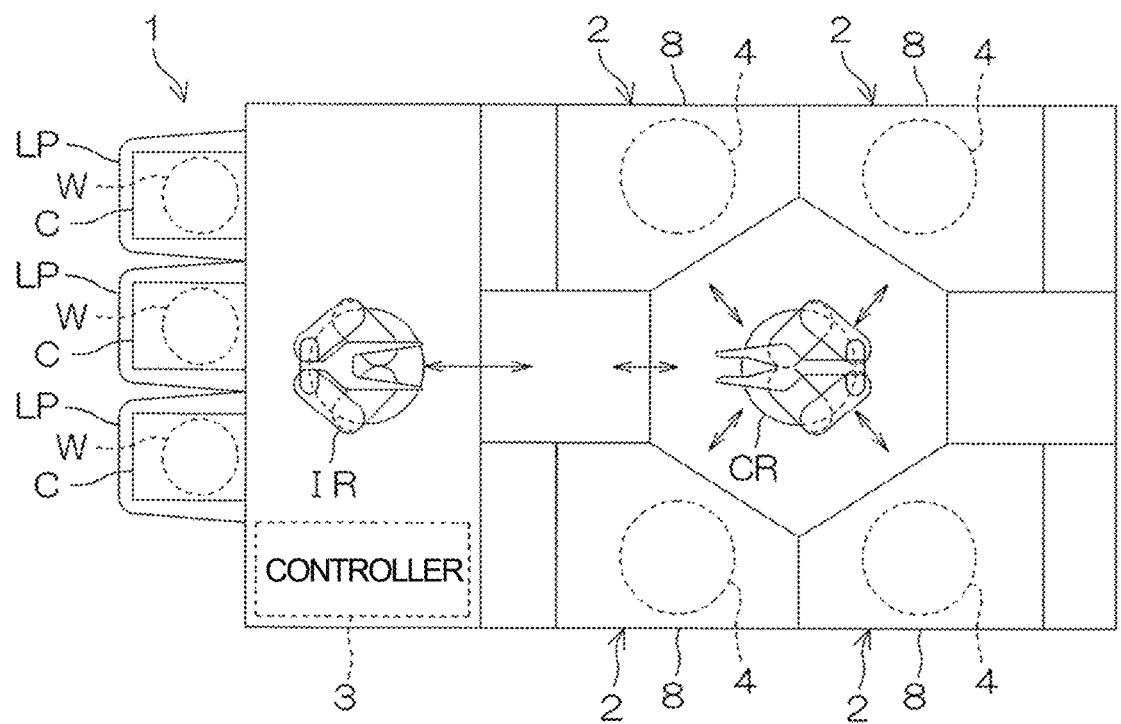
FIG. 1 is a schematic plan view showing an internal layout of a substrate processing apparatus according to a first embodiment of the present disclosure.

FIG. 1 is a schematic plan view for explaining an internal layout of a substrate processing apparatus 1 according to a first embodiment of the present disclosure. The substrate processing apparatus 1 is a single wafer processing apparatus which processes substrates W such as silicon wafers one by one.

Figure 2:
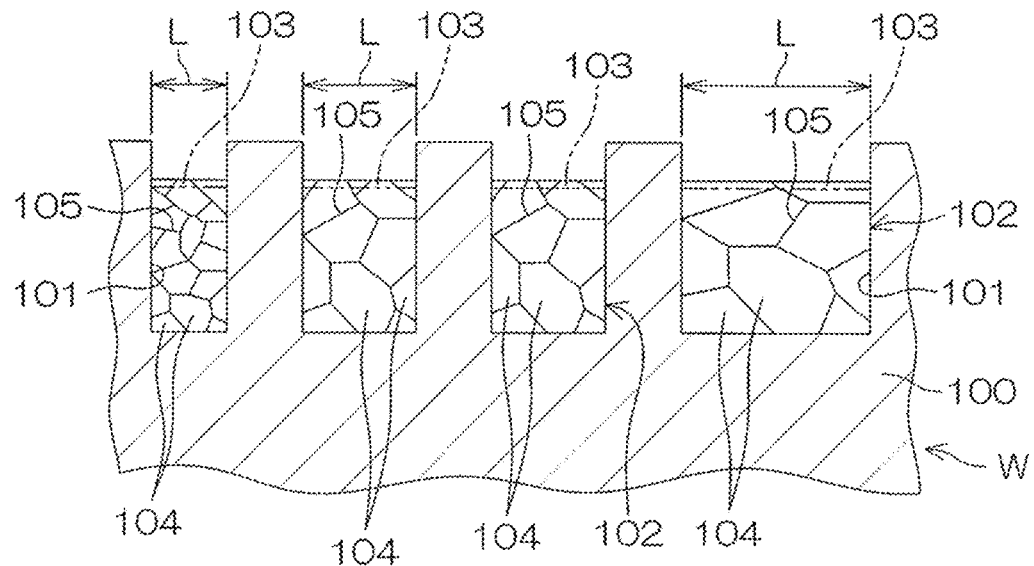
FIG. 2 is a cross-sectional view of the vicinity of a surface layer of the substrate processed by the substrate processing apparatus.

The substrate W processed by the substrate processing apparatus 1 is, for example, a disk-shaped substrate. FIG. 2 is a cross-sectional view of the vicinity of a surface layer of the substrate W. As shown in FIG. 2, the substrate W includes an insulating layer 100 in which a plurality of trenches 101 (recessed parts) is formed in the vicinity of the surface layer, and a copper wiring 102 (a metal layer) formed in each of the trenches 101 in a manner of a surface thereof is exposed. A copper oxide layer 103 is formed by oxidizing a surface layer of the copper wiring 102.

Each of the trenches 101 has a line shape, for example. A width L of the line-shaped trench 101 is a size of the trench 101 in a direction orthogonal to a direction in which the trench 101 extends and a thickness direction of the substrate W. The widths L of the plurality of trenches 101 is not all the same, and the trenches 101 having at least two types of widths L are formed in the vicinity of the surface layer of the substrate W.

In the substrate processing which will be described later, the copper oxide layer 103 is formed on a surface of the copper wiring 102. The width L is also a width of each of the copper wiring 102 and the copper oxide layer 103.

The copper wiring 102 is formed by crystal growth using an electroplating technique or the like with a seed layer (not shown) formed in the trench 101 as a nucleus through a technique such as sputtering.

The copper wiring 102 and the copper oxide layer 103 are constituted by a plurality of crystal grains 104. An interface between the crystal grains 104 is called a crystal grain boundary 105. A distance between copper atoms (copper oxide molecules) in the crystal grain boundary 105 is wider than that between copper atoms (copper oxide molecules) constituting the crystal grains 104. Therefore, a gap in which an etching solution such as an acidic chemical solution that will be described later can enter is present between the copper atoms (the copper oxide molecules) in the crystal grain boundary 105. The gap between the copper atoms in the crystal grain boundary 105 is, for example, 2.6 Å. The gap between the copper oxide molecules in the crystal grain boundary 105 is, for example, 3 Å to 12 Å.

The crystal grain boundary 105 is a kind of lattice defect and is formed by disorder of atomic arrangement. A dimension of the gap between the copper atoms (the copper oxide molecules) in the crystal grain boundary 105 is also a dimension of the lattice defect in the crystal grain boundary 105.

When a metal crystal is grown in the trench 101 formed in a surface of the substrate, a size of the copper crystal grain 104 formed in the trench 101 changes according to the width L of the trench 101. Specifically, as the width L of the trench 101 becomes narrower, the copper crystal grains 104 are less likely to grow. As the width L of the trench 101 becomes wider, the copper crystal grains 104 are easier to grow. Therefore, as the width L of the trench 101 becomes narrower, it is easier to make a small crystal grain 104, and as the width L of the trench 101 becomes wider, it is easier to make a large crystal grain 104. That is, a density of the crystal grain boundary 105 is higher as the width L of the trench 101 is narrower, and the density of the crystal grain boundary 105 is lower as the width L of the trench 101 is wider.

Sparseness and denseness of each of the copper wirings 102 is inherited by the corresponding copper oxide layer 103. That is, also in the copper oxide layer 103, the density of the crystal grain boundary 105 is higher as the width L of the trench 101 is smaller, and the density of the crystal grain boundary 105 is lower as the width L of the trench 101 is wider.

Referring to FIG. 1, the substrate processing apparatus 1 includes a plurality of processing units 2 which processes the substrate W with a processing solution, a load port LP on which a carrier C that accommodates a plurality of substrates W processed by the processing unit 2 is placed, transfer robots IR and CR which transfer the substrate W between the load port LP and the processing unit 2, and a controller 3 which controls the substrate processing apparatus 1.

The transfer robot IR transfers the substrate W between the carrier C and the transfer robot CR. The transfer robot CR transfers the substrate W between the transfer robot IR and the processing unit 2. The plurality of processing units 2 has the same configuration, for example. The processing solution includes an oxidizing fluid, an etching solution, a rinse solution, an organic solvent, a coating agent, and the like which will be described later.

Each of the processing units 2 includes a chamber 8 and a processing cup 4 disposed in the chamber 8. An entrance (not shown) through which the substrate W is loaded into the chamber 8 and the substrate W is unloaded from the chamber 8 is formed in the chamber 8. A shutter unit (not shown) which opens and closes the entrance is provided at the chamber 8.

Figure 3:
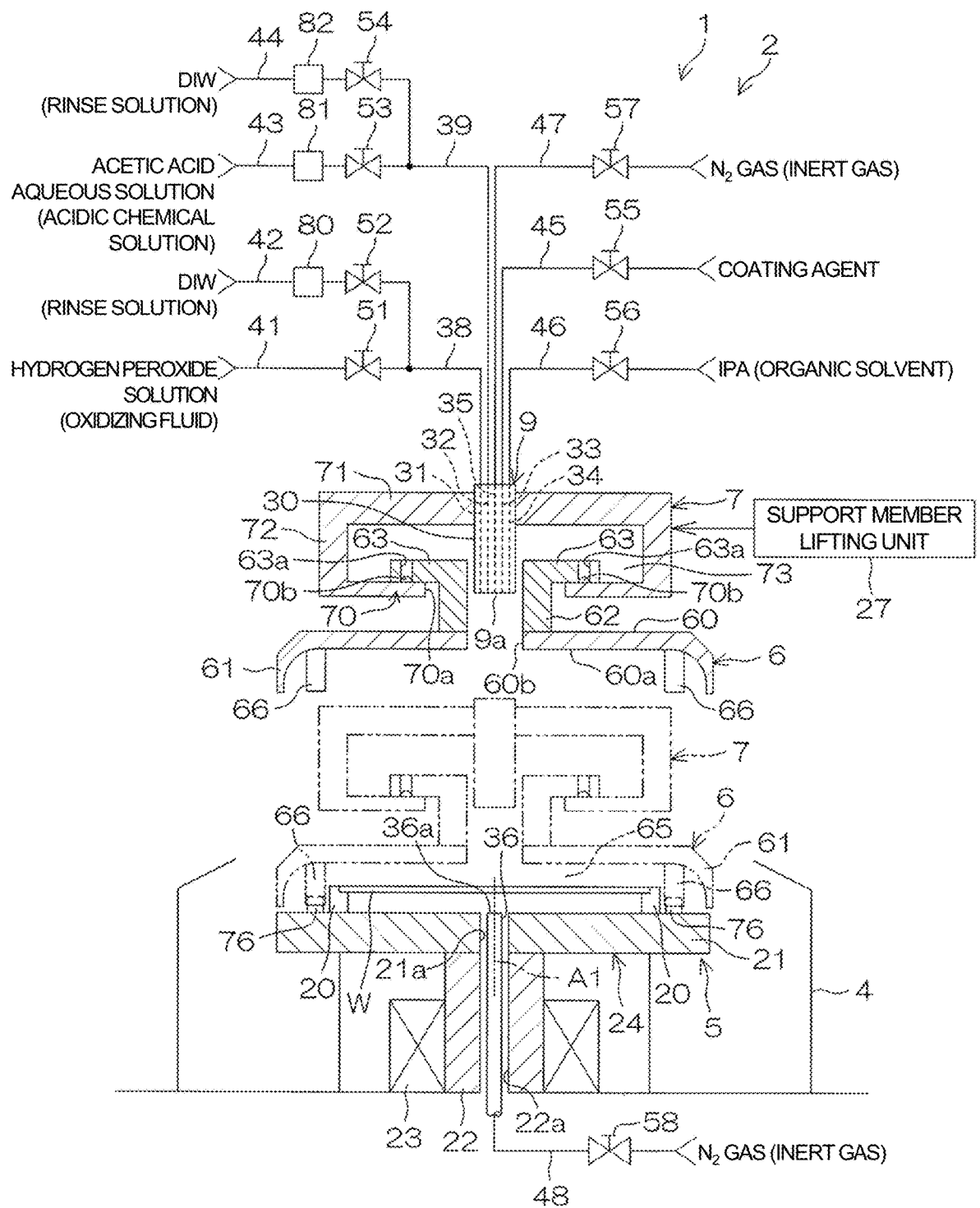
FIG. 3 is a schematic view of a processing unit provided in the substrate processing apparatus.

FIG. 3 is a schematic diagram for explaining a configuration example of the processing unit 2. The processing unit 2 further includes a spin chuck 5, a facing member 6 which faces an upper surface (an upper main surface; a surface) of the substrate W held by the spin chuck 5, and a support member 7 which supports the facing member 6 in a suspended manner.

The spin chuck 5 rotates the substrate W around a rotational axis A1 while holding the substrate W horizontally. The rotational axis A1 is a vertical axis which passes through a center portion of the substrate W. The spin chuck 5 includes a substrate holding unit 24, a rotating shaft 22, and a spin motor 23.

The substrate holding unit 24 holds the substrate W horizontally. The substrate holding unit 24 includes a spin base 21 and a plurality of chuck pins 20. The spin base 21 has a disk shape in a horizontal direction. The plurality of chuck pins 20 is disposed on an upper surface of the spin base 21 with a gap therebetween in a circumferential direction. The plurality of chuck pins 20 grasps the substrate W at a position spaced upward from the upper surface of the spin base 21. The substrate holding unit 24 is also referred to as a substrate holder.

The rotating shaft 22 extends along the rotational axis A1 in a vertical direction. An upper end portion of the rotating shaft 22 is coupled to a center of a lower surface of the spin base 21. In a central region of the spin base 21 in a plan view, a through hole 21a which passes through the spin base 21 in the vertical direction is formed. The through hole 21a communicates with an internal space 22a of the rotating shaft 22.

The spin motor 23 gives a rotational force to the rotating shaft 22. The spin base 21 is rotated by the rotating shaft 22 being rotated by the spin motor 23. Thus, the substrate W is rotated around the rotational axis A1. Hereinafter, the radially inward direction centered on the rotational axis A1 is simply referred to as "radially inward," and the radially outward direction centered on the rotational axis A1 is simply referred to as "radially outward." The spin motor 23 is an example of a substrate rotation unit which rotates the substrate W around the rotational axis A1.

The facing member 6 includes a facing part 60, an annular part 61, a tubular part 62, and a plurality of flange parts 63.

The facing part 60 faces the upper surface of the substrate W from above. The facing part 60 has a disk shape in a plan view. The facing part 60 is disposed substantially horizontally above the spin chuck 5. The facing part 60 has a facing surface 60a which faces the upper surface of the substrate W. A through hole 60b which passes through the facing part 60 in the vertical direction is formed in a center portion of the facing part 60.

The annular part 61 extends downward from a peripheral edge portion of the facing part 60. The annular part 61 surrounds the substrate W in a plan view. An inner peripheral surface of the annular part 61 is concavely curved to be directed radially outward as it goes downward. An outer peripheral surface of the annular part 61 extends in the vertical direction.

The tubular part 62 is fixed to an upper surface of the facing part 60. The tubular part 62 has a tubular shape centered on the rotational axis A1. An internal space of the tubular part 62 communicates with the through hole 60b of the facing part 60. The plurality of flange parts 63 is disposed at an upper end of the tubular part 62 to be spaced apart from each other in the circumferential direction of the tubular part 62. Each of the flange parts 63 extends horizontally from the upper end of the tubular part 62.

As will be described in detail later, the facing member 6 can move up and down with respect to the substrate holding unit 24. For example, when the facing member 6 approaches the substrate holding unit 24, the facing member 6 is engaged with the substrate holding unit 24 by a magnetic force. Specifically, the facing member 6 includes a plurality of first engaging parts 66. The plurality of first engaging parts 66 extend downward from the facing part 60 on the radially inward side from the annular part 61. The plurality of first engaging parts 66 is disposed to be spaced apart from each other in the circumferential direction around the rotational axis A1.

The substrate holding unit 24 includes a plurality of second engaging parts 76 which can be engaged with the plurality of first engaging parts 66 in a concavo-convex manner. The plurality of second engaging parts 76 is disposed on the upper surface of the spin base 21 on the radially outward side from the plurality of chuck pins 20 to be spaced apart from each other in the circumferential direction around the rotational axis A1.

When the first engaging parts 66 of the facing member 6 and the corresponding second engaging parts 76 of the substrate holding unit 24 are engaged, the facing member 6 can rotate integrally with the spin base 21. The spin motor 23 also serves as a facing member rotation unit which rotates the facing member 6 around the rotational axis A1. When the facing member 6 is engaged with the substrate holding unit 24, the annular part 61 surrounds the substrate W from the radially outward side (lateral side) (refer to the two-dot chain line in FIG. 3).

The processing unit 2 further includes a central nozzle 9 which faces a center of the substrate W from above. A discharge port 9a provided at a tip end of the central nozzle 9 is accommodated in the internal space of the tubular part 62 of the facing member 6.

The central nozzle 9 includes a plurality of tubes (a first tube 31, a second tube 32, a third tube 33, a fourth tube 34 and a fifth tube 35) through which a fluid is discharged downward, and a tubular casing 30 which surrounds the plurality of tubes. The plurality of tubes and the casing 30 extend along the rotational axis A1 in the vertical direction. The discharge port 9a of the central nozzle 9 is also a discharge port for the plurality of tubes.

The first tube 31 functions as an oxidizing fluid supply unit which supplies an oxidizing fluid such as a hydrogen peroxide ($H_2O_2$) solution to the upper surface of the substrate W, and as a first rinse solution supply unit which supplies a rinse solution (a first rinse solution) such as deionized water (DIW) to the upper surface of the substrate W.

The first tube 31 is connected to a first common pipe 38 through which both the oxidizing fluid and the rinse solution pass. The first common pipe 38 is branched into an oxidizing fluid pipe 41 in which an oxidizing fluid valve 51 is interposed, and a first rinse solution pipe 42 in which a first rinse solution valve 52 is interposed. In addition to the first rinse solution valve 52, a degassing unit 80 which degasses the rinse solution is interposed in the first rinse solution pipe 42.

When the oxidizing fluid valve 51 is opened, the oxidizing fluid is supplied to the first tube 31 via the oxidizing fluid pipe 41 and the first common pipe 38. Additionally, the oxidizing fluid is continuously discharged downward from the discharge port of the first tube 31 (the discharge port 9a of the central nozzle 9). When the first rinse solution valve 52 is opened, the rinse solution is supplied to the first tube 31 via the first rinse solution pipe 42 and the first common pipe 38. Additionally, the rinse solution is degassed by the degassing unit 80 and is continuously discharged downward from the discharge port of the first tube 31. That is, the fluid discharged from the first tube 31 is switched between the oxidizing fluid and the rinse solution by controlling the oxidizing fluid valve 51 and the first rinse solution valve 52.

The oxidizing fluid discharged from the first tube 31 oxidizes the surface layer of the copper wiring 102 of the substrate W and forms the copper oxide layer 103. The oxidizing fluid discharged from the first tube 31 preferably has sufficient oxidizing power to form the copper oxide layer 103 composed of a single atomic layer or several atomic layers on the surface layer of the copper wiring 102 of the substrate W. A technique for etching a metal layer in units of single atomic layer or several atomic layers is called atomic layer wet etching (ALWE). The several atomic layers are 2 to 10 atomic layers.

In order to form the copper oxide layer 103 composed of a single atomic layer or several atomic layers, the pH of the oxidizing fluid discharged from the first tube 31 is preferably 6 to 8, and more preferably 7. In order to form the copper oxide layer 103 composed of a single atomic layer or several atomic layers, a redox potential of the oxidizing fluid discharged from the first tube 31 is preferably equal to or lower than that of the hydrogen peroxide solution.

As described above, the oxidizing fluid serves as a denaturalization fluid which denaturalizes (oxidizes) a metal layer into a metal oxide layer. That is, in the embodiment, the copper wiring 102 serves as a layer to be denaturalized, and the copper oxide layer 103 serves as a processing target layer. That is, the first tube 31 also serves as a denaturalization fluid supply unit which supplies the denaturalization fluid to the upper surface of the substrate W.

When the oxidizing fluid discharged from the first tube 31 is a hydrogen peroxide solution, a concentration of hydrogen peroxide in the oxidizing fluid is preferably 1 ppm to 100 ppm.

The oxidizing fluid discharged from the first tube 31 is not limited to the hydrogen peroxide solution. The oxidizing fluid discharged from the first tube 31 may be a fluid containing at least one of perchloric acid ($HClO_4$), nitric acid ($HNO_3$), a mixed solution (SC1) of ammonia and hydrogen peroxide solution, ozonized deionized water ($DIO_3$), oxygen ($O_2$) dissolved water, dry air, and ozone gas.

The rinse solution discharged from the first tube 31 is not limited to DIW and may be carbonated water, electrolytic ion water, hydrochloric acid water having a diluted concentration (for example, about 1 ppm to 100 ppm), diluted ammonia water having a diluted concentration (for example, about 1 ppm to 100 ppm), or reduced water (hydrogen water). The rinse solution discharged from the first tube 31 is preferably degassed.

The second tube 32 functions as an acidic chemical solution supply unit which supplies an acidic chemical solution such as an acetic acid aqueous solution to the upper surface of the substrate W, and as a second rinse solution supply unit which supplies a rinse solution (a second rinse solution) such as DIW to the upper surface of the substrate W. The acidic chemical solution discharged from the second tube 32 is an example of the etching solution. That is, the second tube 32 is also an example of an etching solution supply unit.

The second tube 32 is connected to a second common pipe 39 through which both the acidic chemical solution and the second rinse solution pass. The second common pipe 39 is branched into an acidic chemical solution pipe 43 in which an acidic chemical solution valve 53 is interposed, and a second rinse solution pipe 44 in which a second rinse solution valve 54 is interposed. A degassing unit 81 for degassing the acidic chemical solution is interposed in the acidic chemical solution pipe 43. A degassing unit 82 which degasses the second rinse solution is interposed in the second rinse solution pipe 44.

When the acidic chemical solution valve 53 is opened, the acidic chemical solution degassed by the degassing unit 81 is supplied to the second tube 32 via the acidic chemical solution pipe 43 and the second common pipe 39. The acidic chemical solution is continuously discharged downward from the discharge port of the second tube 32 (the discharge port 9a of the central nozzle 9). When the second rinse solution valve 54 is opened, the rinse solution degassed by the degassing unit 82 is supplied to the second tube 32 via the second rinse solution pipe 44 and the second common pipe 39. The rinse solution is continuously discharged downward from the discharge port of the second tube 32. That is, the fluid discharged from the second tube 32 is switched between the acidic chemical solution and the second rinse solution by controlling the acidic chemical solution valve 53 and the second rinse solution valve 54.

The acidic chemical solution discharged from the second tube 32 etches the copper oxide layer 103. The acidic chemical solution discharged from the second tube 32 can selectively remove the copper oxide layer 103 of the substrate W. Therefore, the dissolved oxygen in the acidic chemical solution discharged from the second tube 32 is preferably reduced. Specifically, a dissolved oxygen concentration in the acidic chemical solution is preferably 200 ppb or less, and more preferably 70 ppb or less.

When an acetic acid aqueous solution is used as the acidic chemical solution discharged from the second tube 32, the etching rate for the copper wiring 102 is constant regardless of a density of the crystal grain boundary 105. Specifically, when the acetic acid aqueous solution is used as the acidic chemical solution discharged from the second tube 32, the etching rate for the crystal grain 104 (the etching rate of the crystal grain) in the copper wiring 102 is equal to the etching rate for the crystal grain boundary 105 (the etching rate of the crystal grain boundary) in the copper wiring 102. Even when citric acid is used as the acidic chemical solution, the etching rate of the crystal grain and the etching rate of the crystal grain boundary are equal.

The etching rate for the copper wiring 102 does not need to be completely constant regardless of the density of the crystal grain boundary 105 and may be substantially constant regardless of the density of the crystal grain boundary 105. That is, the etching rate may vary according to the density of the crystal grain boundary 105 as long as the semiconductor element using the substrate W processed by the substrate processing apparatus 1 according to the embodiment functions normally.

Similarly, the etching rate of the crystal grain and the etching rate of the crystal grain boundary do not need to be completely coincident with each other, and the etching rates may be substantially equal. The etching rate of the crystal grain and the etching rate of the crystal grain boundary are substantially equal means that the etching rate of the crystal grain and the etching rate of the crystal grain boundary are equal so that the semiconductor element using the substrate W processed by the substrate processing apparatus 1 according to the embodiment functions normally. Specifically, when a ratio of the maximum value of the etching rate to the minimum value of the etching rate on the surface of the substrate is 2.0 or less, the etching rate of the crystal grain and the etching rate of the crystal grain boundary are considered to be substantially equal.

It is preferable that the acidic chemical solution discharged from the second tube 32 mainly contain a compound having a size larger than the gap present in the crystal grain boundary 105 as a reaction compound which reacts with the copper oxide molecules 108 when the copper oxide layer 103 is etched. To this end, the acidic chemical solution discharged from the second tube 32 is preferably an acetic acid aqueous solution or a citric acid aqueous solution but is not limited thereto. That is, the acidic chemical solution discharged from the second tube 32 may be an aqueous solution containing an organic acid other than acetic acid and citric acid.

The "size of the reaction compound" is the total size of ions of the reaction compound and hydrogen ions paired in an aqueous solution when the acidic chemical solution is the aqueous solution. That is, when the reaction compound is acetic acid, the size of the acetic acid is the total size of acetic acid ions and hydrogen ions which have been paired. When the reaction compound is citric acid, the size of citric acid is the total size of citric acid ions and hydrogen ions which have been paired.

The total (ion pair) size of fluoride ions and hydrogen ions contained in hydrofluoric acid which is a kind of inorganic acid is the same as or smaller than the gap present in the crystal grain boundaries 105. The size of acetic acid or citric acid is larger than that of the hydrogen fluoride and also larger than the gap present in the crystal grain boundary 105. While a molecular size of hydrogen fluoride is 0.91 Å, a molecular size of acetic acid calculated from a molecular model is about 5 Å, and a molecular size of citric acid is about 10 Å. The total (ion pair) size of the acetic acid ions and hydrogen ions which have been paired is considered to be larger than a size of the gap, specifically, more than 12 Å.

The expression "the acidic chemical solution mainly contains a compound having a size larger than the gap present in the crystal grain boundary 105 as a reaction compound" means that, when the acidic chemical solution contains a single reaction compound, the single reaction compound has a size larger than the gap present in the crystal grain boundary 105. The expression "the acidic chemical solution mainly contains a compound having a size larger than the gap present in the crystal grain boundary 105 as a reaction compound" means that, when the acidic chemical solution contains a plurality of reaction compounds, a molar fraction of a compound having a size larger than the gap present in the crystal grain boundary 105 is the largest among the reaction compounds contained in the acidic chemical solution.

The organic acid aqueous solution discharged from the second tube 32 may be an aqueous solution containing, for example, at least one of ethylenediaminetetraacetic acid (EDTA), formic acid, acetic and a hydroxy acid such as citric acid, glycolic acid, and malic acid. The second tube 32 is also an organic acid supply unit. Further, the acidic chemical solution need not be an organic acid aqueous solution and may be a melt of an organic acid.

When the acidic chemical solution discharged from the second tube 32 mainly contains the compound having the size larger than the gap present in the crystal grain boundary 105 as the reaction compound, a compound having a size which is the same as or smaller than the gap present in the crystal grain boundary 105 (for example, hydrogen fluoride) may be contained as the reaction compound.

The rinse solution discharged from the second tube 32 is not limited to DIW and may be carbonated water, electrolytic ion water, hydrochloric acid water having a diluted concentration (for example, about 1 ppm to 100 ppm), diluted ammonia water having a diluted concentration (for example, about 1 ppm to 100 ppm), or reduced water (hydrogen water). The rinse solution discharged from the second tube 32 is preferably degassed.

The third tube 33 functions as a coating agent supply unit which supplies a coating agent to the upper surface of the substrate W. The coating agent is a solution which forms a coating film that covers and protects the upper surface of the substrate W. Although it will be described later in detail, the coating agent contains a solvent and a solute. The coating film which covers the surface of the substrate W is formed by evaporating the solvent contained in the coating agent. The coating film may simply cover the surface of the substrate W, or may cover the surface of the substrate W in a state in which it is integrated with the surface of the insulating layer 100 or the surface of the copper wiring 102 by a chemical reaction. Oxidation of the copper wiring 102 of the substrate W is prevented by forming the coating film.

The third tube 33 is connected to a coating agent pipe 45 in which a coating agent valve 55 is interposed. When the coating agent valve 55 is opened, the coating agent is supplied from the coating agent pipe 45 to the third tube 33 and is continuously discharged downward from the discharge port of the third tube 33 (the discharge port 9a of the central nozzle 9).

The coating agent discharged from the third tube 33 is, for example, a solution in which a sublimable acrylic polymer is dissolved as a solute in an organic solvent. The organic solvent for dissolving the sublimable acrylic polymer may be 1-ethoxy-2-propanol (PGEE), or the like. The coating agent discharged from the third tube 33 may be a surface water repellent.

Examples of the surface water repellent include a solution obtained by dissolving an organic silane such as hexamethyldisilazane in an organic solvent, and a solution obtained by dissolving an alkanethiol such as decanethiol in an organic solvent. Examples of the organic solvent for dissolving the organic silane include 2-acetoxy-1-methoxypropane (PGMEA) and the like. Examples of the organic solvent for dissolving the alkanethiol include heptane and the like. When organic thiol is used, oxidation of the surface of the copper wiring 102 is prevented by a thiol organic molecular layer being formed as the coating film on the surface of the copper wiring 102.

The fourth tube 34 functions as an organic solvent supply unit which supplies an organic solvent such as isopropyl alcohol (IPA) to the upper surface of the substrate W. The fourth tube 34 is connected to an organic solvent pipe 46 in which an organic solvent valve 56 is interposed. When the organic solvent valve 56 is opened, the organic solvent is supplied from the organic solvent pipe 46 to the fourth tube 34 and is continuously discharged downward from the discharge port of the fourth tube 34 (the discharge port 9a of the central nozzle 9).

The organic solvent discharged from the fourth tube 34 may be an organic solvent other than IPA as long as it is miscible with both the rinse solution and the coating agent. More specifically, the organic solvent discharged from the fourth tube 34 may be a solution containing at least one of IPA, hydrofluoroether (HFE), methanol, ethanol, acetone, and Trans-1,2-dichloroethylene.

The fifth tube 35 functions as an inert gas supply unit which discharges an inert gas such as nitrogen gas ($N_2$ gas). The fifth tube 35 is connected to a first inert gas pipe 47 in which a first inert gas valve 57 is interposed. When the first inert gas valve 57 is opened, the inert gas is supplied from the first inert gas pipe 47 to the fifth tube 35 and is continuously discharged downward from the discharge port of the fifth tube 35 (the discharge port 9a of the central nozzle 9). The inert gas discharged from the fifth tube 35 is supplied to a space 65 between the facing surface 60a of the facing part 60 and the upper surface of the substrate W through the internal space of the tubular part 62 of the facing member 6 and the through hole 60b of the facing part 60.

The inert gas is a gas which is inert to the insulating layer 100, the copper wiring 102, the copper oxide layer 103, and the like (refer to FIG. 2) formed on the upper surface of the substrate W. The inert gas discharged from the fifth tube 35 is not limited to nitrogen gas and may be, for example, a rare gas such as argon.

The processing unit 2 includes a lower surface nozzle 36 which discharges an inert gas such as nitrogen gas toward a center portion of the lower surface of the substrate W. The lower surface nozzle 36 is inserted into the through hole 21a which is open at a center portion of the upper surface of the spin base 21 and the internal space 22a of the rotating shaft 22. A discharge port 36a of the lower surface nozzle 36 is exposed from the upper surface of the spin base 21. The discharge port 36a of the lower surface nozzle 36 faces the center portion of the lower surface of the substrate W from below. The lower surface nozzle 36 is connected to a second inert gas pipe 48 in which a second inert gas valve 58 is interposed.

When the second inert gas valve 58 is opened, the inert gas is supplied from the second inert gas pipe 48 to the lower surface nozzle 36 and is continuously discharged upward from the discharge port 36a of the lower surface nozzle 36. Even when the spin chuck 5 rotates the substrate W, the lower surface nozzle 36 does not rotate.

The inert gas discharged from the lower surface nozzle 36 is not limited to nitrogen gas and may be, for example, a rare gas such as argon.

The support member 7 includes a facing member support part 70 which supports the facing member 6, a nozzle support part 71 which is provided above the facing member support part 70 and supports the casing 30 of the central nozzle 9, and a wall part 72 which connects the facing member support part 70 to the nozzle support part 71 and extends in the vertical direction.

A space 73 is partitioned by the facing member support part 70, the nozzle support part 71, and the wall part 72. The facing member support part 70 constitutes a lower wall of the support member 7. The nozzle support part 71 constitutes an upper wall of the support member 7. The space 73 accommodates an upper end portion of the tubular part 62 of the facing member 6 and the flange part 63. The casing 30 and the nozzle support part 71 are in close contact with each other.

The facing member support part 70 supports the facing member 6 (more specifically, the flange part 63) from below. A tubular part insertion hole 70a through which the tubular part 62 is inserted is formed in a center portion of the facing member support part 70. A positioning hole 63a which passes through the flange part 63 in the vertical direction is formed in each of the flange parts 63. An engagement protrusion 70b which can be engaged with the positioning hole 63a of the corresponding flange part 63 is formed on the facing member support part 70. The facing member 6 is positioned with respect to the support member 7 in a rotation direction around the rotational axis A1 by engaging the engagement protrusions 70b corresponding to the positioning holes 63a.

The processing unit 2 includes a support member lifting unit 27 which moves the support member 7 up and down. The support member lifting unit 27 includes, for example, a ball screw mechanism (not shown) which moves the support member 7 up and down, and an electric motor (not shown) which applies a driving force to the ball screw mechanism. The support member lifting unit 27 is also referred to as a support member lifter.

The support member lifting unit 27 can position the support member 7 at a predetermined height position between an upper position (a position shown by a solid line in FIG. 3) and a lower position (a position shown in FIG. 6A to be described later). The lower position is a position in which the support member 7 is closest to the upper surface of the spin base 21 in a movable range of the support member 7. The upper position is a position in which the support member 7 is farthest from the upper surface of the spin base 21 in the movable range of the support member 7.

When the support member 7 is located at the upper position, the support member 7 suspends and supports the facing member 6. When the support member 7 is lifted up and down between the upper position and the lower position by the support member lifting unit 27, the support member 7 passes through an engagement position (a position indicated by a two-dot chain line in FIG. 3) between the upper position and the lower position.

The support member 7 is lifted down together with the facing member 6 from the upper position to the engagement position. When the support member 7 reaches the engagement position, the support member 7 transfers the facing member 6 to the substrate holding unit 24. When the support member 7 reaches below the engagement position, the support member 7 is separated from the facing member 6.

When the support member 7 is lifted up from the lower position and reaches the engagement position, the support member 7 receives the facing member 6 from the substrate holding unit 24. The support member 7 is lifted up together with the facing member 6 from the engagement position to the upper position.

In this way, the facing member 6 is lifted up and down with respect to the substrate holding unit 24 when the support member 7 is lifted up and down by the support member lifting unit 27. Thus, the support member lifting unit 27 serves as a facing member lifting unit. That is, the support member lifting unit 27 is also referred to as a facing member lifter (a blocking plate lifter) because the facing member 6 is also lifted up and down.

Figure 4:
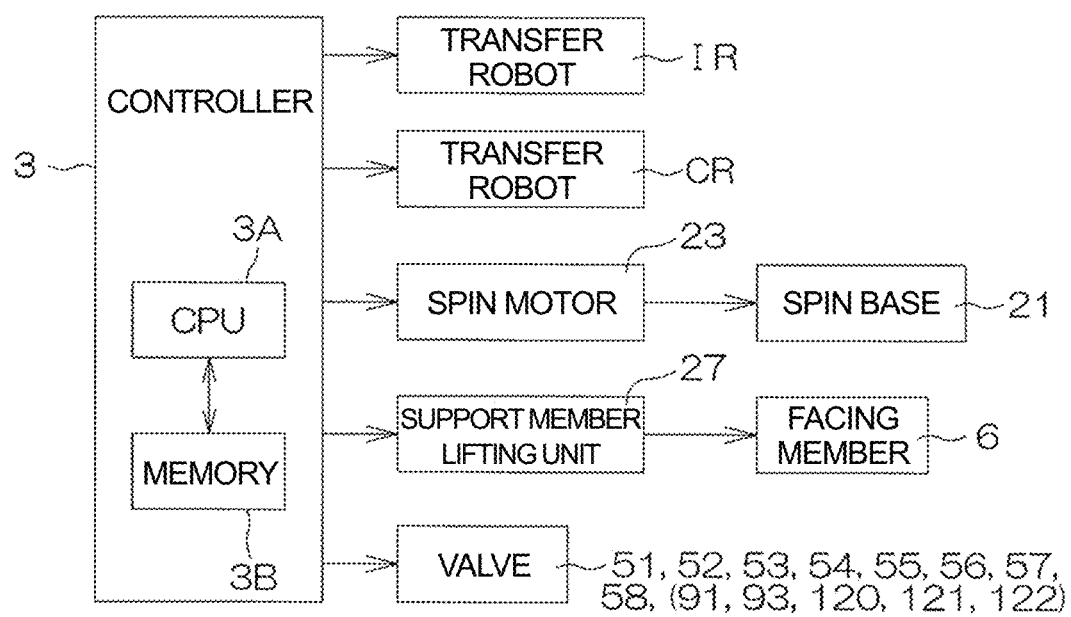
FIG. 4 is a block diagram showing an electrical configuration of a main part of the substrate processing apparatus.

FIG. 4 is a block diagram for explaining an electrical configuration of a main part of the substrate processing apparatus 1. The controller 3 includes a microcomputer and controls a control target provided in the substrate processing apparatus 1 according to a predetermined program. More specifically, the controller 3 includes a processor (CPU) 3A and a memory 3B in which a program is stored. The controller 3 is configured to perform various controls for substrate processing by the processor 3A executing the program.

In particular, the controller 3 controls operations of the transfer robots IR and CR, the spin motor 23, the support member lifting unit 27, the oxidizing fluid valve 51, the first rinse solution valve 52, the acidic chemical solution valve 53, the second rinse solution valve 54, the coating agent valve 55, the organic solvent valve 56, the first inert gas valve 57, the second inert gas valve 58, and the like. The discharge of a fluid from the corresponding nozzle or tube is controlled by controlling the valves.

Figure 5:
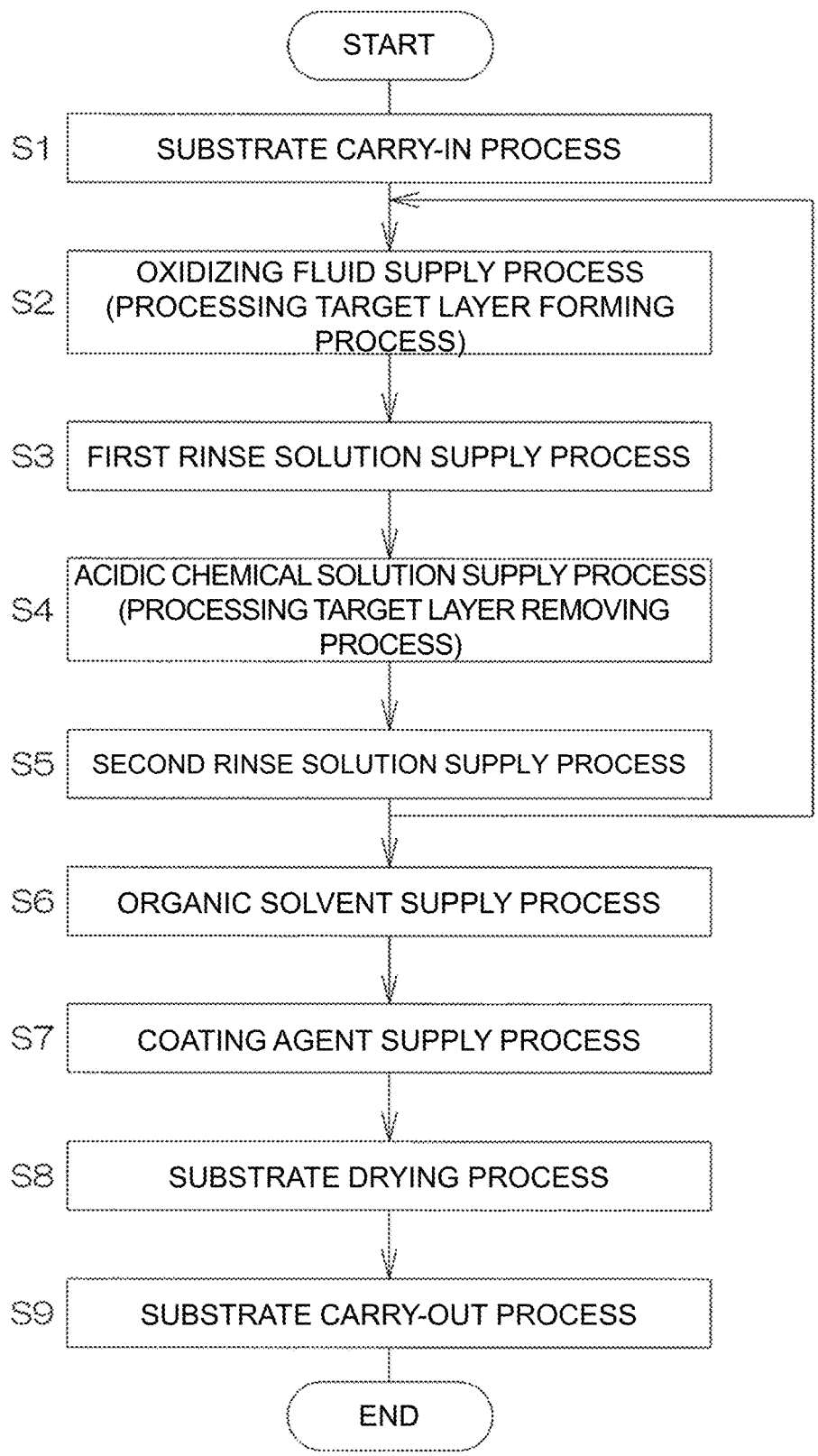
FIG. 5 is a flowchart for explaining an example of substrate processing by the substrate processing apparatus.

FIG. 5 is a flowchart for explaining an example of the substrate processing by the substrate processing apparatus 1 and mainly shows processing realized by the controller 3 executing a program. FIGS. 6A to 6E are illustrative cross-sectional views showing the substrate processing. Hereinafter, the substrate processing by the substrate processing apparatus 1 will be described mainly with reference to FIGS. 3 and 5. FIGS. 6A to 6E will be referred appropriately.

In the substrate processing by the substrate processing apparatus 1, for example, as shown in FIG. 5, a substrate carry-in process (Step S1), an oxidizing fluid supply process (Step S2), a first rinse solution supply process (Step S3), an acidic chemical solution supply process (Step S4), a second rinse solution supply process (Step S5), an organic solvent supply process (Step S6), a coating agent supply process (Step S7), a substrate drying process (Step S8), and a substrate carry-out process (Step S9) are performed in this order.

In this example of the substrate processing, after the second rinse solution supply process (Step S5), the oxidizing fluid supply process (Step S2) to the second rinse solution supply process (Step S5) are repeated a predetermined number of times. Thereafter, the processes after the organic solvent supply process (Step S6) are performed.

Specifically, first, before the substrate W is carried into the processing unit 2, a relative position between the facing member 6 and the substrate holding unit 24 in the rotation direction is adjusted so that the facing member 6 and the substrate holding unit 24 can be engaged with each other. Specifically, in a plan view, the spin motor 23 adjusts the position of the substrate holding unit 24 in the rotation direction so that the first engaging part 66 of the facing member 6 and the second engaging part 76 of the substrate holding unit 24 overlap.

Additionally, the substrate W having the upper surface on which the plurality of trenches 101 is formed is prepared (a substrate preparation process). Referring also to FIG. 1, in the substrate processing by the substrate processing apparatus 1, the substrate W is carried into the processing unit 2 from the carrier C by the transfer robots IR and CR and is transferred to the spin chuck 5 (Step S1). Thereafter, the substrate W is horizontally held by the chuck pins 20 with a gap upward from the upper surface of the spin base 21 until it is carried out by the transfer robot CR (a substrate holding process). Additionally, the substrate W is rotated by the spin motor 23 rotating the spin base 21 (a substrate rotation process).

Figure 6A:
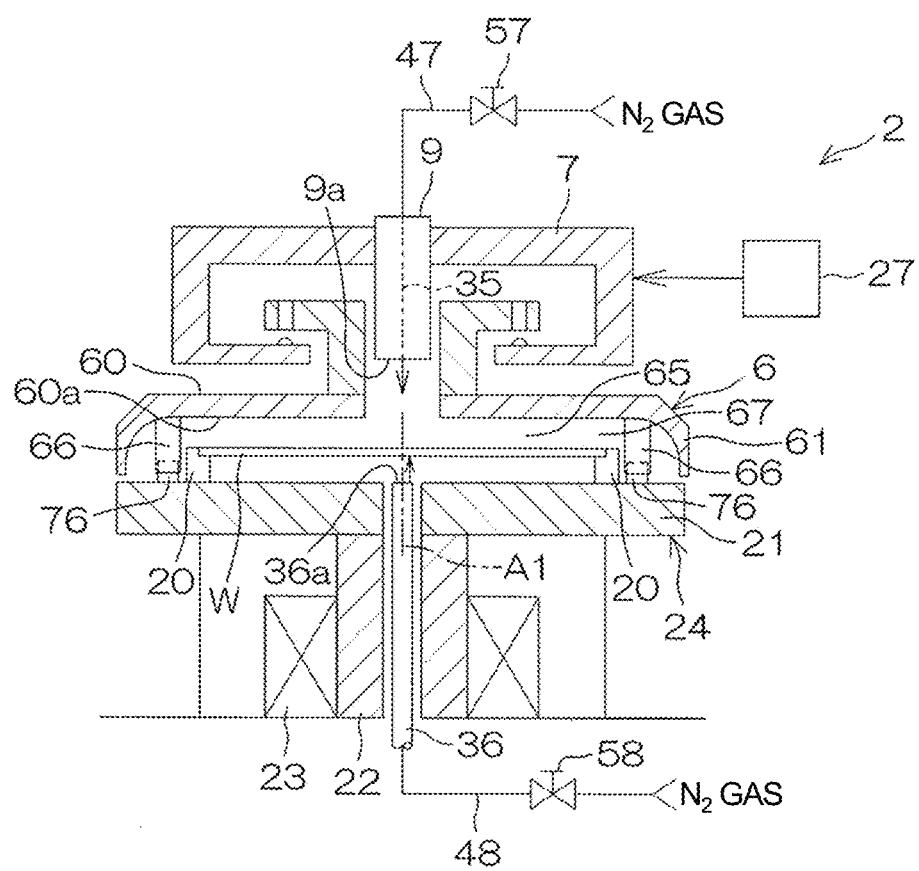
FIGS. 6A to 6E are illustrative cross-sectional views showing the substrate processing.

Then, as shown in FIG. 6A, the support member lifting unit 27 lifts down the support member 7 located at the upper position to the lower position. The support member 7 passes through the engagement position before it moves to the lower position. When the support member 7 passes through the engagement position, the facing member 6 and the substrate holding unit 24 are engaged by a magnetic force. Therefore, the facing member 6 is disposed by the support member lifting unit 27 at a position in which the annular part 61 surrounds the substrate W from the radially outward side (lateral side) (a facing member arrangement process). Thus, the substrate W is accommodated in an accommodation space 67 defined by the facing member 6 and the spin base 21. The space 65 between the upper surface of the substrate W and the facing surface 60a of the facing part 60 is a part of the accommodation space 67.

In a state in which the support member 7 reaches the lower position, the first inert gas valve 57 and the second inert gas valve 58 are opened. Thus, an inert gas such as nitrogen gas ($N_2$ gas) is supplied from the fifth tube 35 toward the upper surface of the substrate W, and an inert gas such as nitrogen gas ($N_2$ gas) is supplied from the lower surface nozzle 36 toward the lower surface of the substrate W. The nitrogen gas supplied toward the lower surface of the substrate W goes around to the upper surface side of the substrate W. Therefore, the nitrogen gas discharged from the lower surface nozzle 36 is supplied to the space 65 as a result. Accordingly, the atmosphere in the entire accommodation space 67 is replaced with the inert gas, and as a result, the atmosphere in the space 65 is replaced with the inert gas (a replacement process). That is, an oxygen concentration in the space 65 is reduced.

Figure 6B:
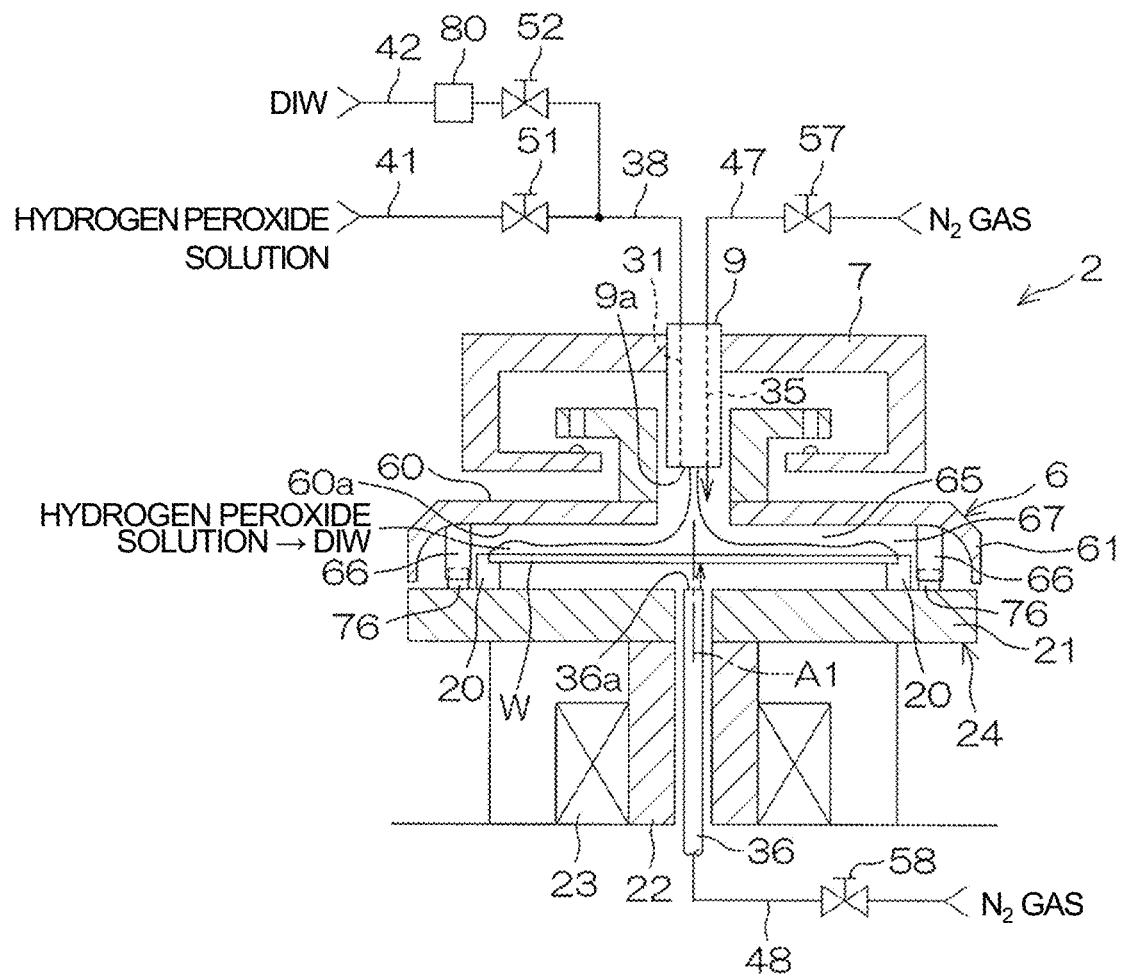

Next, the oxidizing fluid supply process (Step S2) is performed. Specifically, the oxidizing fluid valve 51 is opened while the space 65 is filled with an inert gas. Therefore, as shown in FIG. 6B, the oxidizing fluid (the denaturalization fluid) such as hydrogen peroxide solution is supplied (discharged) from the first tube 31 toward a central region on the upper surface of the substrate W (the oxidizing fluid supply process, an oxidizing fluid discharge process).

The oxidizing fluid spreads evenly over the entire upper surface of the substrate W by a centrifugal force. The oxidizing fluid on the substrate W is scattered radially outward from the substrate W by a centrifugal force and is received by the processing cup 4.

The surface layer of the copper wiring 102 (refer to FIG. 2) of the substrate W is oxidized (denaturalized) by supplying the oxidizing fluid to the upper surface of the substrate W, and the copper oxide layer 103 (refer to FIG. 2) is formed (a metal oxide layer forming process, a processing target layer forming process).

Next, the first rinse solution supply process (Step S3) is performed. Specifically, after the supply of the oxidizing fluid to the upper surface of the substrate W is continued for a predetermined time (for example, 10 seconds), the oxidizing fluid valve 51 is closed and the first rinse solution valve 52 is opened. Thus, the supply of the oxidizing fluid from the first tube 31 to the central region on the upper surface of the substrate W is stopped, and the rinse solution such as DIW is supplied (discharged) from the first tube 31 to the central region on the upper surface of the substrate W (the first rinse solution supply process, a first rinse solution discharge process). That is, the fluid supplied to the upper surface of the substrate W is switched from the hydrogen peroxide solution to DIW (hydrogen peroxide solution→DIW).

The rinse solution discharged from the first tube 31 is a rinse solution degassed by the degassing unit 80 interposed in the first rinse solution pipe 42 (a degassed first rinse solution supply process). When the rinse solution is discharged from the first tube 31, the atmosphere in the accommodation space 67 (the space 65) has already been replaced with an inert gas. That is, the rinse solution is supplied to the upper surface of the substrate W while maintaining the dissolved oxygen concentration when degassed.

The rinse solution spreads evenly over the entire upper surface of the substrate W by the centrifugal force. Therefore, the oxidizing fluid on the substrate W is washed away by the rinse solution. The oxidizing fluid and the rinse solution on the substrate W are scattered radially outward from the substrate W by the centrifugal force and are received by the processing cup 4.

Figure 6C:
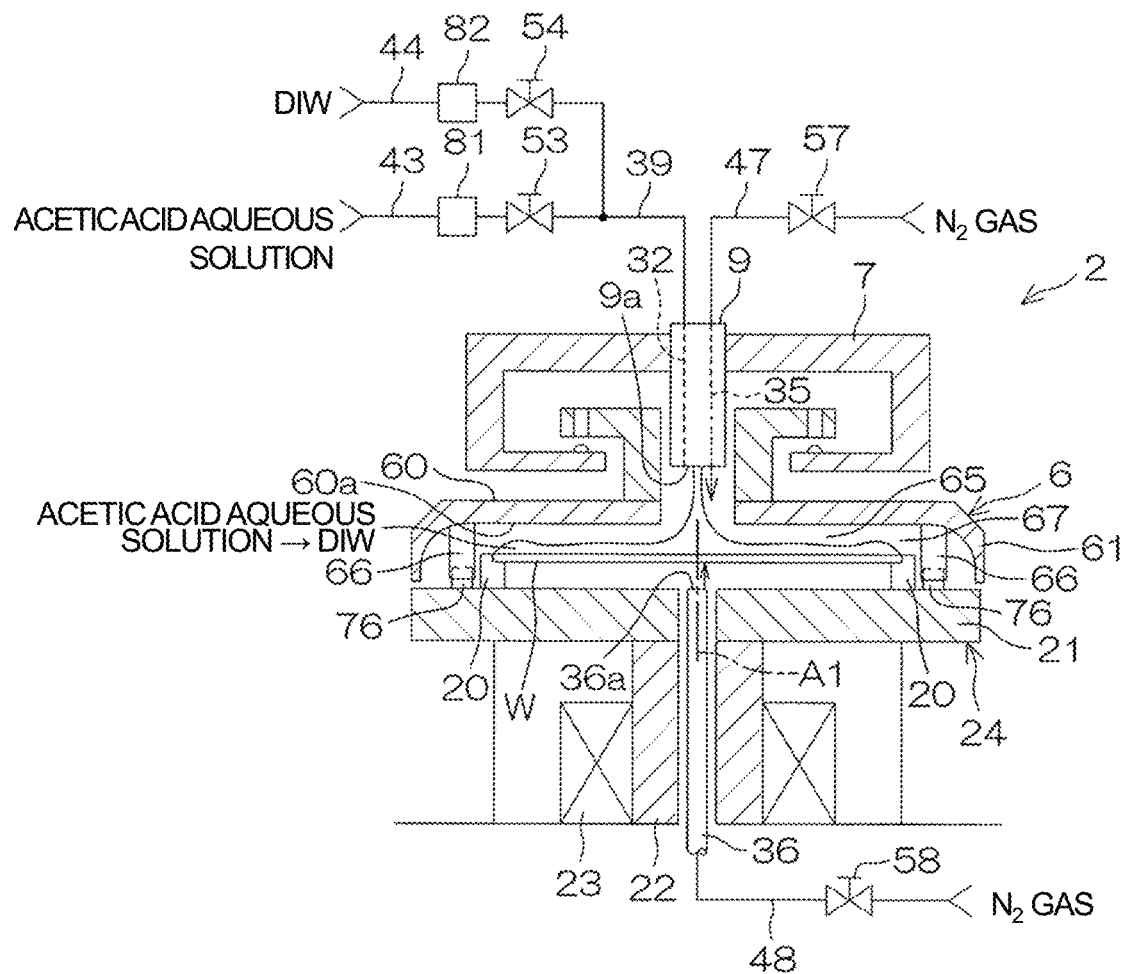

Next, the acidic chemical solution supply process (Step S4) is performed. After the supply of the rinse solution to the upper surface of the substrate W is continued for a predetermined time (for example, 10 seconds), the first rinse solution valve 52 is closed. Then, the acidic chemical solution valve 53 is opened. Thus, as shown in FIG. 6C, the acidic chemical solution such as an acetic acid aqueous solution is supplied (discharged) from the second tube 32 toward the central region on the upper surface of the substrate W (the acidic chemical solution supply process, an acidic chemical solution discharge process).

Since the acidic chemical solution is an example of the etching solution, the acidic chemical solution supply process is also an etching solution supply process. Moreover, in the embodiment, since the acetic acid aqueous solution containing an organic acid is used as the acidic chemical solution, the acidic chemical solution supply process is also an organic acid supply process.

The acidic chemical solution which has landed on the upper surface of the substrate W spreads evenly over the entire upper surface of the substrate W by the centrifugal force. Thus, the rinse solution on the substrate W is replaced with the acidic chemical solution. The oxidizing fluid and the rinse solution on the substrate W are scattered radially outward from the substrate W by the centrifugal force and are received by the processing cup 4.

The copper oxide layer 103 (refer to FIG. 2) of the substrate W is selectively removed by supplying the acidic chemical solution to the upper surface of the substrate W (a metal oxide layer removing process, a processing target layer removing process). That is, a portion of the copper wiring 102 of the substrate W which has been oxidized by the oxidizing fluid to become the copper oxide layer 103 is selectively removed. In the processing target layer removing process, in all the trenches 101, at least a part of the copper wiring 102 is denaturalized into the copper oxide layer 103, and the copper oxide layer 103 is etched and removed.

The acidic chemical solution discharged from the second tube 32 is an acidic chemical solution degassed by the degassing unit 81 interposed in the acidic chemical solution pipe 43 (a degassed acidic chemical solution supply process). When the acidic chemical solution is discharged from the second tube 32, the atmosphere in the accommodation space 67 (the space 65) has already been replaced with the inert gas. That is, the acidic chemical solution is supplied to the upper surface of the substrate W while maintaining the dissolved oxygen concentration when degassed.

The dissolved oxygen concentration in the acidic chemical solution is preferably 200 ppb or less, and more preferably 70 ppb or less. In this way, an acidic chemical solution having a very low dissolved oxygen concentration is supplied to the upper surface of the substrate W. Therefore, the copper oxide layer 103 is further selectively removed by the acidic chemical solution.

Next, the second rinse solution supply process (Step S5) is performed. After the supply of the acidic chemical solution to the upper surface of the substrate W is continued for a predetermined time (for example, 10 seconds), the acidic chemical solution valve 53 is closed, and instead, the second rinse solution valve 54 is opened. Therefore, the rinse solution such as DIW is supplied (discharged) from the second tube 32 toward the central region on the upper surface of the substrate W (the second rinse solution supply process, a second rinse solution discharge process). That is, the fluid supplied to the upper surface of the substrate W is switched from the acetic acid aqueous solution to DIW (acetic acid aqueous solution→DIW).

The rinse solution spreads evenly over the entire upper surface of the substrate W by the centrifugal force. Thus, the acidic chemical solution on the substrate W is washed away by the rinse solution. The acidic chemical solution and the rinse solution on the substrate W are scattered radially outward from the substrate W by the centrifugal force and are received by the processing cup 4.

The rinse solution discharged from the second tube 32 is a rinse solution degassed by the degassing unit 82 interposed in the second rinse solution pipe 44 (a degassed second rinse solution supply process). When the rinse solution is discharged from the second tube 32, the atmosphere in the accommodation space 67 (the space 65) has already been replaced with the inert gas. That is, the rinse solution is supplied to the upper surface of the substrate W while maintaining the dissolved oxygen concentration when degassed.

In the second rinse solution supply process (Step S5), after the supply of the rinse solution to the upper surface of the substrate W is continued for a predetermined time (for example, 10 seconds), the second rinse solution valve 54 is closed, and instead, the oxidizing fluid valve 51 is opened. Therefore, the oxidizing fluid supply process (Step S2) is performed again. Then, following the oxidizing fluid supply process (Step S2) performed for the second time, the first rinse solution supply process (Step S3), the acidic chemical solution supply process (Step S4), and the second rinse solution supply process (Step S5) are sequentially performed. Thereafter, the oxidizing fluid supply process (Step S2) to the second rinse solution supply process (Step S5) are performed a predetermined number of times. Thus, the processing target layer forming process and the processing target layer removing process are alternately performed multiple times.

After the oxidizing fluid supply process (Step S2) to the second rinse solution supply process (Step S5) are performed a predetermined number of times, the processes after the organic solvent supply process (Step S6) are performed. In other words, after the final second rinse solution supply process (Step S5), the processes after the organic solvent supply process (Step S6) are performed. The metal oxide layer forming process and the metal oxide layer removing process are performed once (one cycle) by performing the oxidizing fluid supply process (Step S2) to the second rinse solution supply process (Step S5) once.

Figure 6D:
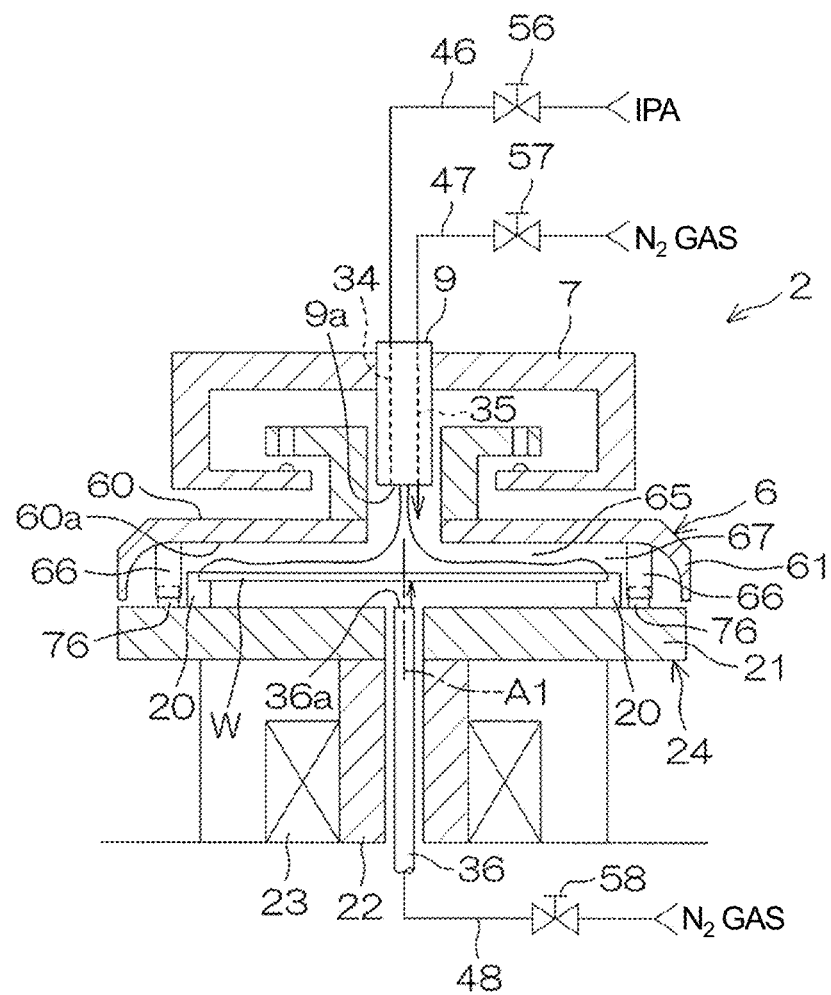

After the final second rinse solution supply process (Step S5), the organic solvent supply process (Step S6) is performed. Specifically, after the supply of the rinse solution to the upper surface of the substrate W is continued for a predetermined time (for example, 10 seconds), the second rinse solution valve 54 is closed, and instead, the organic solvent valve 56 is opened. Accordingly, as shown in FIG. 6D, the organic solvent such as IPA is supplied (discharged) from the fourth tube 34 toward the central region of the upper surface of the substrate W (the organic solvent supply process, an organic solvent discharge process).

The organic solvent spreads evenly over the entire upper surface of the substrate W by the centrifugal force. The organic solvent is miscible with the second rinse solution. Therefore, the second rinse solution on the substrate W is removed from the substrate W together with the newly supplied organic solvent. Thus, the second rinse solution on the substrate W is replaced with the organic solvent. The second rinse solution and the organic solvent on the substrate W are scattered radially outward from the substrate W by the centrifugal force and are received by the processing cup 4.

Figure 6E:
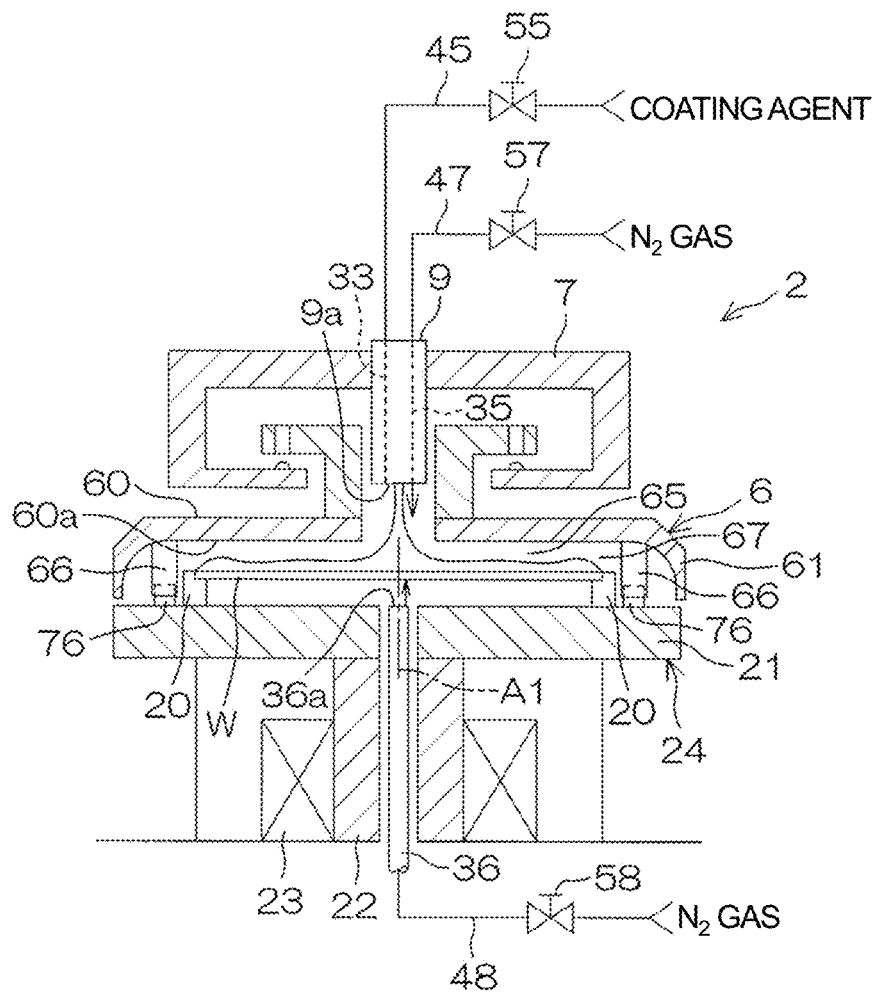

Next, the coating agent supply process (Step S7) is performed. Specifically, after the supply of the organic solvent to the upper surface of the substrate W is continued for a predetermined time (for example, 10 seconds), the organic solvent valve 56 is closed, and instead, the coating agent valve 55 is opened. Therefore, as shown in FIG. 6E, the coating agent is supplied (discharged) from the third tube 33 toward the central region of the upper surface of the substrate W (the coating agent supply process, a coating agent discharge process).

The coating agent spreads evenly over the entire upper surface of the substrate W by the centrifugal force. The coating agent is miscible with the organic solvent. Therefore, the organic solvent on the substrate W is removed from the substrate W together with the newly supplied coating agent. Thus, the organic solvent on the substrate W is replaced with the coating agent, and the upper surface of the substrate W is covered with the coating agent. The organic solvent and the coating agent on the substrate W are scattered radially outward from the substrate W by the centrifugal force and are received by the processing cup 4.

Next, the substrate drying process (Step S8) is performed. Specifically, the coating agent valve 55 is closed. Therefore, the supply of the coating agent to the upper surface of the substrate W is stopped. Then, a coating film is formed on the substrate W by evaporating the organic solvent in the coating agent on the substrate W by at least one of the centrifugal force due to rotation of the substrate W and spraying of nitrogen gas. At this time, the organic solvent in the coating agent may be evaporated by heating the substrate W with a heater (not shown) or the like built in the spin base 21.

Then, the spin motor 23 rotates the substrate W at 2000 rpm, for example. Thus, a solution component on the substrate W is shaken off, and the substrate W is dried.

Thereafter, the spin motor 23 stops the rotation of the spin chuck 5. Then, the first inert gas valve 57 and the second inert gas valve 58 are closed. Additionally, the support member lifting unit 27 moves the support member 7 to the upper position. Thereafter, referring also to FIG. 1, the transfer robot CR enters the processing unit 2, picks up the processed substrate W from the spin chuck 5 and carries it out of the processing unit 2 (Step S9: the substrate carry-out process). The substrate W is transferred from the transfer robot CR to the transfer robot IR and is then stored in the carrier C by the transfer robot IR.

Figure 7A:
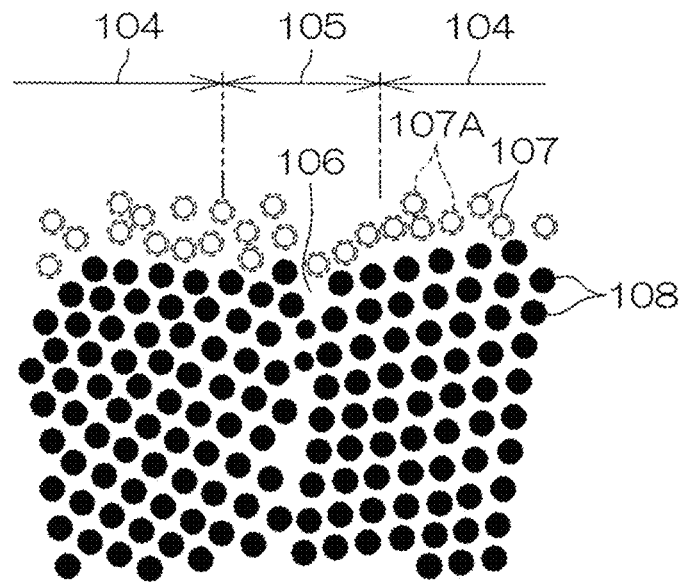
FIGS. 7A and 7B are schematic diagrams for explaining an etching rate when a hydrofluoric acid is used as an acidic chemical solution.
Figure 7B:
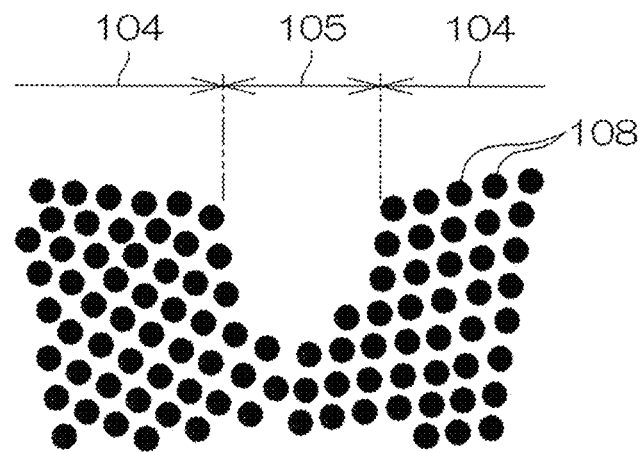

Here, unlike the embodiment, it is assumed that the acidic chemical solution is a solution (hydrofluoric acid) mainly containing hydrogen fluoride as a reaction compound which reacts with the copper oxide molecules 108 when the copper oxide layer 103 is etched. A size of hydrogen fluoride (a size of an ion pair 107A in which fluoride ions 107 and hydrogen ions are paired) is the same as or smaller than a gap 106 present in the crystal grain boundary 105. Therefore, as shown in FIG. 7A, the ion pair 107A in which the fluoride ions 107 and the hydrogen ions contained in the acidic chemical solution are paired easily enters a space between the copper oxide molecules 108 in the crystal grain boundary 105. That is, the reaction compound easily enters the gap 106. Therefore, as shown in FIG. 7B, the etching is likely to proceed in the crystal grain boundary 105.

Therefore, when a hydrofluoric acid mainly containing hydrogen fluoride as the reaction compound is used as the acidic chemical solution, the etching rate increases as the density of the crystal grain boundary of the copper oxide layer 103 increases.

Figure 8A:
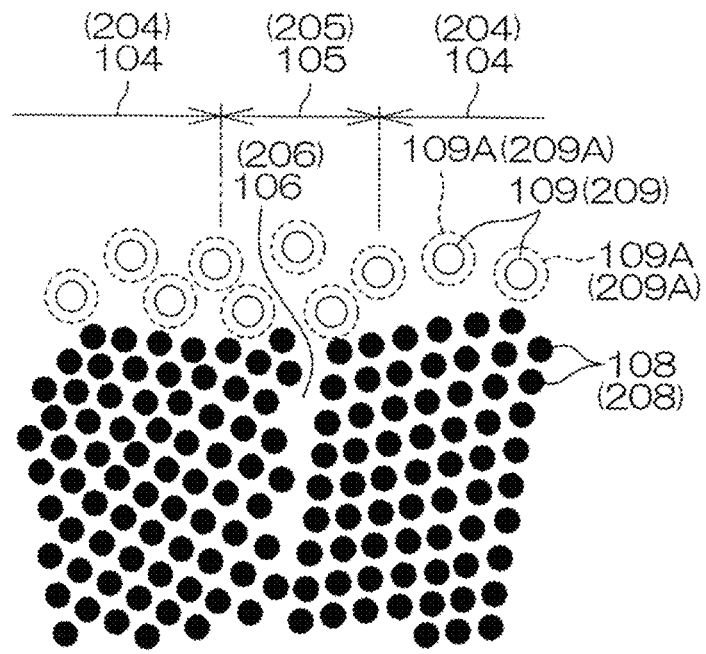
FIGS. 8A and 8B are schematic diagrams for explaining a state of etching at a crystal grain boundary when an acetic acid is used as the acidic chemical solution.
Figure 8B:
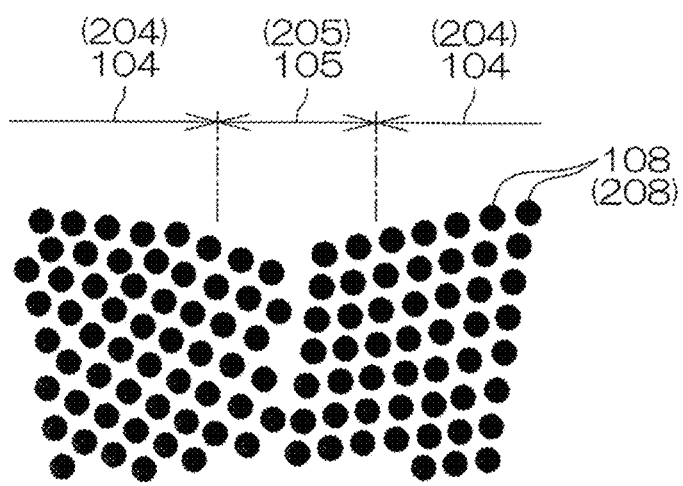

On the other hand, as in the first embodiment, when the acidic chemical solution is an acetic acid aqueous solution containing an acetic acid having a size larger than the gap 106 present in the crystal grain boundary 105 as the reaction compound, as shown in FIG. 8A, an ion pair 109A in which acetic acid molecules 109 and hydrogen ions contained in the acidic chemical solution are paired is unlikely to enter between the copper oxide molecules 108 in the crystal grain boundary 105. That is, the reaction compound is difficult to enter the gap 106. Therefore, as shown in FIG. 8B, the etching progresses to the same extent in both the crystal grains 104 and the crystal grain boundary 105. That is, when the acidic chemical solution mainly contains an organic acid such as acetic acid as the reaction compound, the etching rate is substantially constant regardless of the density of the crystal grain boundary. In other words, when the acidic chemical solution mainly contains an organic acid such as acetic acid as the reaction compound, the etching rate of the crystal grain and the etching rate of the crystal grain boundary are substantially equal.

Accordingly, when the acidic chemical solution mainly contains an organic acid such as acetic acid as the reaction compound, the copper oxide layer 103 can be uniformly etched and removed from the trench 101 regardless of the density of the crystal grain boundary of the copper oxide layer 103. That is, even when a plurality of trenches 101 having different widths L is present in the upper surface of the substrate W, the copper oxide layer 103 can be uniformly removed from the plurality of trenches 101. As a result, the copper oxide layer 103 can be removed from the upper surface of the substrate W without variation.

Further, according to the first embodiment, the copper oxide layer 103 formed by oxidizing the surface layer of the copper wiring 102 is etched by the acidic chemical solution. Therefore, even when the degree of accuracy of the etching is improved by etching the copper oxide layer 103 after denaturalizing the copper wiring 102 into the copper oxide layer 103, an etching solution in which the etching rate of the crystal grain and the etching rate of the crystal grain boundary are the same can be used.

Further, according to the first embodiment, the supply of the acidic chemical solution to the upper surface of the substrate W in the copper oxide layer removing process starts after the supply of the oxidizing fluid to the upper surface of the substrate W in the copper oxide layer forming process is stopped. That is, the supply of the acidic chemical solution starts after the supply of the oxidizing fluid is stopped. Thus, the etching amount of the copper oxide layer 103 can be easily controlled as compared with the case in which the supply of the oxidizing fluid and the supply of the acidic chemical solution are performed in parallel. As a result, the copper oxide layer 103 can be removed from the upper surface of the substrate W without variation while the etching amount of the copper oxide layer 103 is accurately controlled. The etching amount is also referred to as a recess amount or an etching depth.

In general, many organic acid molecules are composed of more atoms than inorganic acid molecules. Therefore, in general, the size of the organic acid is larger than that of the inorganic acid. Therefore, when a solution containing an organic acid is used as the acidic chemical solution, the copper oxide layer 103 can be uniformly etched and removed from the trench 101 regardless of the sparseness and denseness of the crystal grain boundary 105. Thus, even when the plurality of trenches 101 having different widths L is present in the upper surface of the substrate W, the copper oxide layer 103 can be more uniformly removed from the trenches 101. As a result, the copper oxide layer 103 can be removed from the upper surface of the substrate W without variation.

Figure 9:
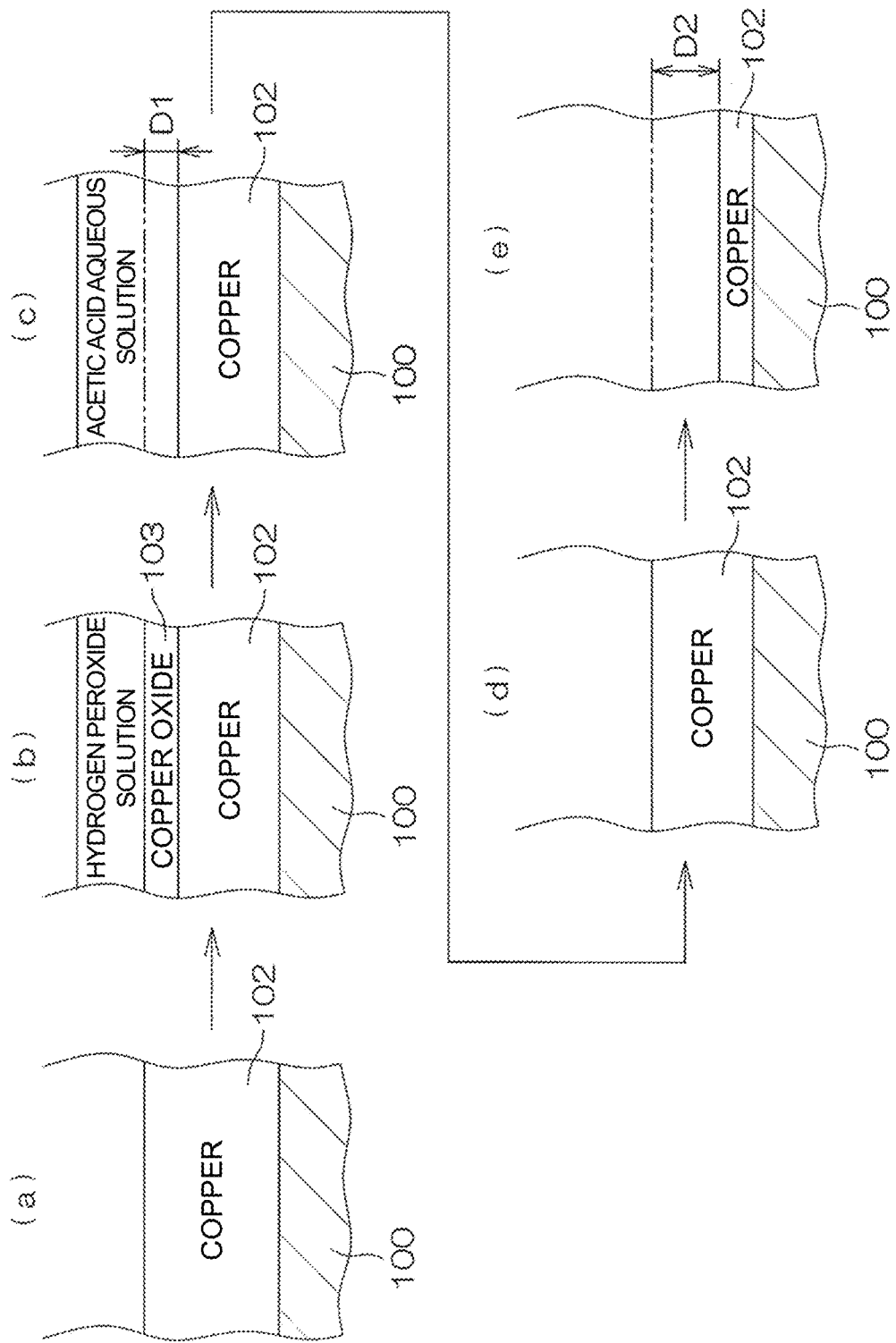
FIG. 9 is a schematic diagram for explaining a change in a surface state of the substrate caused by alternately performing an oxidizing fluid supply process and an etching solution supply process in the substrate processing.

Further, according to the first embodiment, the copper oxide layer 103 composed of single atomic layers or several atomic layers is formed on the surface layer of the copper wiring 102 by supplying the oxidizing fluid such as hydrogen peroxide solution to the upper surface of the substrate W shown in FIGS. 9A and 9B (the metal oxide layer forming process, the processing target layer forming process). Then, as shown in FIG. 9D, the copper oxide layer 103 is selectively removed from the upper surface of the substrate W by supplying the acidic chemical solution (the etching solution) such as an acetic acid aqueous solution to the upper surface of the substrate W as shown in FIG. 9C (the metal oxide layer removing process, the processing target layer removing process).

In the metal oxide layer forming process, the copper oxide layer 103 composed of single atomic layers or several atomic layers is formed. A thickness of single atomic layers of copper and copper oxide is 1 nm or less (for example, 0.3 nm to 0.4 nm). Thus, the etching amount of the metal layer can be controlled with an accuracy of nanometer or less by selectively removing the copper oxide layer 103 in the metal oxide layer removing process. Therefore, even when the plurality of trenches 101 having different widths L is present in the upper surface of the substrate W, the copper oxide layer 103 can be uniformly removed from the trenches 101 in units of atomic layers. As a result, the copper oxide layer 103 can be removed from the upper surface of the substrate W without variation.

Further, according to the first embodiment, the metal oxide layer forming process and the metal oxide layer removing process are alternately performed multiple times. A thickness of the copper wiring 102 to be oxidized is substantially constant by performing the metal oxide layer forming process and the metal oxide layer removing process once. That is, self-aligned oxidation of the copper wiring 102 is achieved. Therefore, the thickness (an etching amount DO of the copper wiring 102 to be etched is substantially constant (refer to FIG. 9C). Therefore, as shown in FIG. 9E, a desired etching amount D2 can be achieved by adjusting the number of times of repeatedly performing the metal oxide layer forming process and the metal oxide layer removing process.

In this way, the stepwise etching of the copper wiring 102 with a constant etching amount is referred to as digital etching. In addition, the etching of the metal layer (the copper wiring 102) by repeatedly performing the metal oxide layer forming process and the metal oxide layer removing process is referred to as cycle etching.

A thickness of the copper oxide layer 103 formed in the metal oxide layer forming process depends on oxidizing power of the oxidizing fluid. The higher the pH is, that is, the higher the basicity is, the higher the oxidizing power of the oxidizing fluid is. Since the hydrogen peroxide solution has a pH of 6 to 8, it has the oxidizing power suitable for forming the copper oxide layer 103 having one to several atomic layers. Therefore, the copper oxide layer 103 having a thickness of nanometer or less can be formed by a method of supplying the hydrogen peroxide solution to the surface of the substrate W to form the copper oxide layer 103.

As described above, in the substrate processing using the substrate processing apparatus 1 of the first embodiment, the oxidizing fluid supply process (Step S2) to the second rinse solution supply process (Step S5) are repeatedly performed. The substrate processing apparatus 1 of the first embodiment may also perform the substrate processing in which each of the processes (Step S2 to Step S5) is performed once without repeating the oxidizing fluid supply process (Step S2) to the second rinse solution supply process (Step S5).

Figure 10:
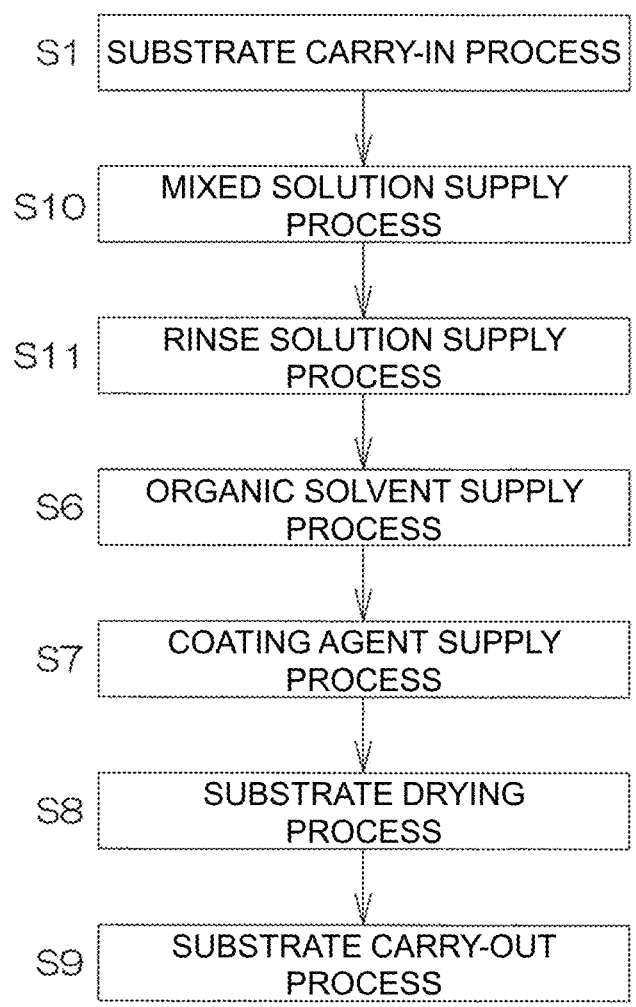
FIG. 10 is a flowchart for explaining another example of the substrate processing.

Further, in the substrate processing apparatus 1 of the first embodiment, as shown in FIG. 10, a mixed solution supply process (Step S10) which supplies a mixed solution of the oxidizing fluid and the acidic chemical solution to the upper surface of the substrate W and a rinse solution supply process (Step S11) which washes out the mixed solution from the upper surface of the substrate W may be performed instead of the oxidizing fluid supply process (Step S2) to the second rinse solution supply process (Step S5). In this substrate processing, each of the processes is not repeated but performed once.

Specifically, after the substrate W is carried into the processing unit 2 and held by the substrate holding unit 24, the facing member 6 and the substrate holding unit 24 are engaged by the magnetic force. Then, the substrate W is rotated around the rotational axis A1 by the spin motor 23 rotating the spin base 21. Then, the space 65 between the upper surface of the substrate W and the facing surface 60a of the facing part 60 is filled with an inert gas. In this state, the oxidizing fluid valve 51 and the acidic chemical solution valve 53 are opened.

Figure 11:
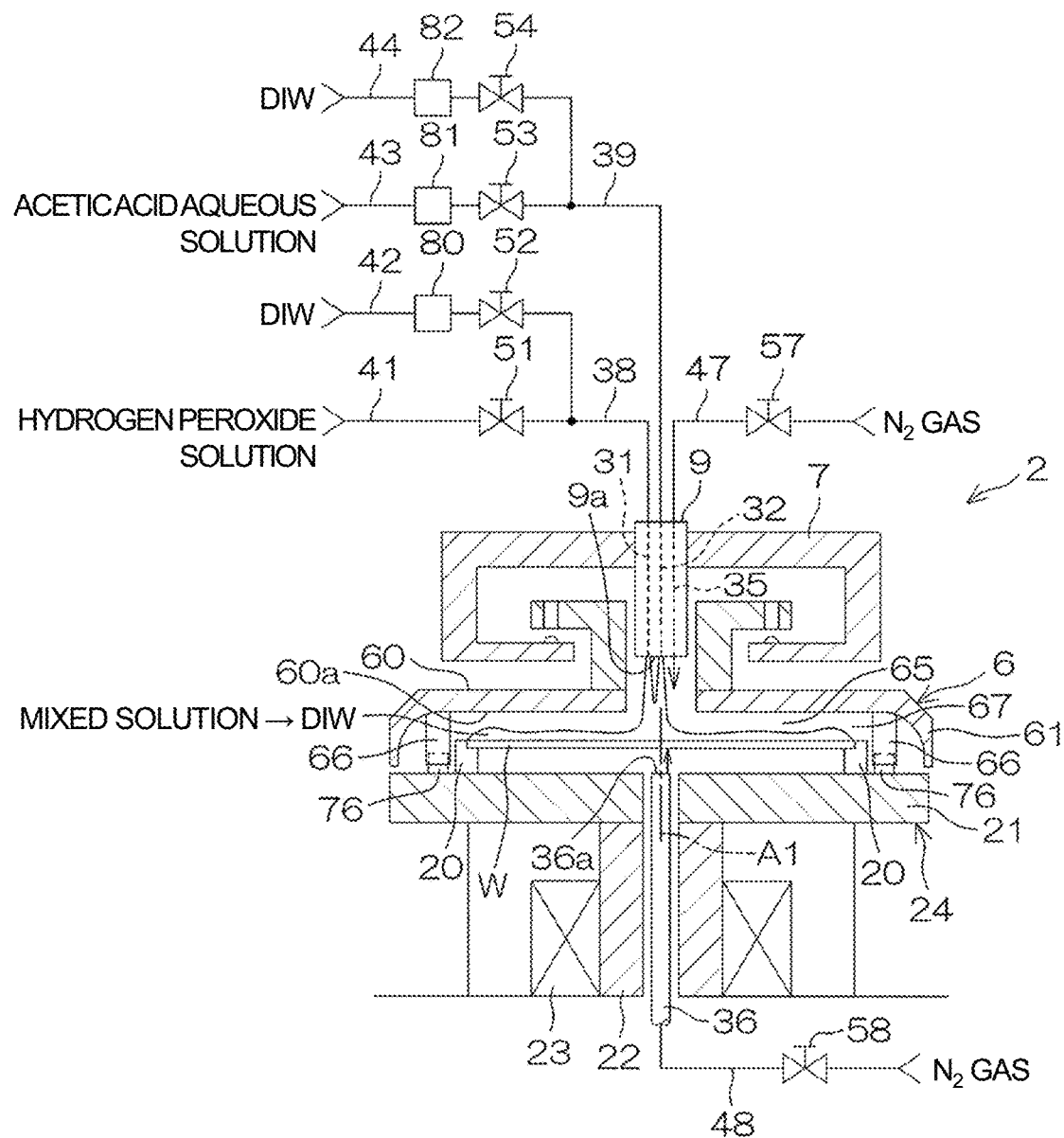
FIG. 11 is an illustrative cross-sectional view showing another example of the substrate processing.

Accordingly, the oxidizing fluid such as hydrogen peroxide solution is supplied (discharged) from the first tube 31 of the central nozzle 9 toward the central region of the upper surface of the substrate W, and the acidic chemical solution such as an acetic acid aqueous solution is supplied (discharged) from the second tube 32 of the central nozzle 9. The oxidizing fluid and the acidic chemical solution discharged from the central nozzle 9 are mixed, for example, at a landing point on the substrate W. Thus, as shown in FIG. 11, a mixed solution of the oxidizing fluid and the acidic chemical solution is formed, and the mixed solution is supplied to the upper surface of the substrate W (the mixed solution supply process). The supply of the acidic chemical solution to the upper surface of the substrate W and the supply of the oxidizing fluid to the upper surface of the substrate W are performed in parallel.

The mixed solution supplied to the upper surface of the substrate W spreads evenly over the entire upper surface of the substrate W by the centrifugal force. The mixed solution on the substrate W is scattered radially outward from the substrate W by the centrifugal force and is received by the processing cup 4.

The forming (the metal oxide layer forming process, the processing target layer forming process) of the copper oxide layer 103 (refer to FIG. 2) by oxidation of the copper wiring 102 (refer to FIG. 2) of the substrate W and the etching of the copper oxide layer 103 are performed simultaneously by supplying the mixed solution on the upper surface of the substrate W (the metal oxide layer removing process, the processing target layer removing process).

Next, the rinse solution supply process (Step S11) is performed. After the supply of the mixed solution to the upper surface of the substrate W is continued for a predetermined time (for example, 10 seconds), the oxidizing fluid valve 51 and the acidic chemical solution valve 53 are closed. On the other hand, the first rinse solution valve 52 and the second rinse solution valve 54 are opened. Thus, the rinse solution such as DIW is supplied (discharged) from the first tube 31 and the second tube 32 toward the central region of the upper surface of the substrate W (the rinse solution supply process, the rinse solution discharge process). That is, the fluid supplied to the upper surface of the substrate W is switched from the mixed solution to DIW (mixed solution→DIW).

The rinse solution supplied to the upper surface of the substrate W spreads evenly over the entire upper surface of the substrate W by the centrifugal force. The mixed solution and the rinse solution on the substrate W are scattered radially outward from the substrate W by the centrifugal force and are received by the processing cup 4.

The rinse solution discharged from the first tube 31 and the second tube 32 is a degassed rinse solution (a degassed rinse solution supply process). When the rinse solution is discharged from the first tube 31 and the second tube 32, the atmosphere in the accommodation space 67 (the space 65) has already been replaced with an inert gas. That is, the rinse solution is supplied to the upper surface of the substrate W while maintaining the dissolved oxygen concentration when degassed. In the rinse solution supply process (Step S11), the rinse solution may be discharged from any one of the first tube 31 and the second tube 32.

Thereafter, similarly to the substrate processing shown in FIG. 5, the organic solvent supply process (Step S6) to the substrate carry-out process (Step S9) are performed.

In this substrate processing, the supply of the acidic chemical solution to the upper surface of the substrate W in the copper oxide layer removing process is performed in parallel with the supply of the oxidizing fluid to the upper surface of the substrate W in the copper oxide layer forming process. Therefore, the copper oxide layer 103 can be removed while denaturalizing the copper wiring 102 into the copper oxide layer 103. Thus, the copper oxide layer 103 can be removed quickly as compared to the case in which the supply of the acidic chemical solution starts after the supply of the oxidizing fluid is stopped. As a result, the copper oxide layer 103 can be removed from the upper surface of the substrate W without variation while the time required for the substrate processing is reduced.

The oxidizing fluid and the acidic chemical solution discharged from the discharge port 9a may be mixed immediately after they are discharged from the discharge port 9a while directed from the discharge port 9a to the upper surface of the substrate W, or when they are landed on the upper surface of the substrate W. It is also possible to perform this substrate processing using a substrate processing apparatus with the central nozzle 9 capable of discharging a mixed solution prepared in advance.

Second Embodiment

Figure 12:
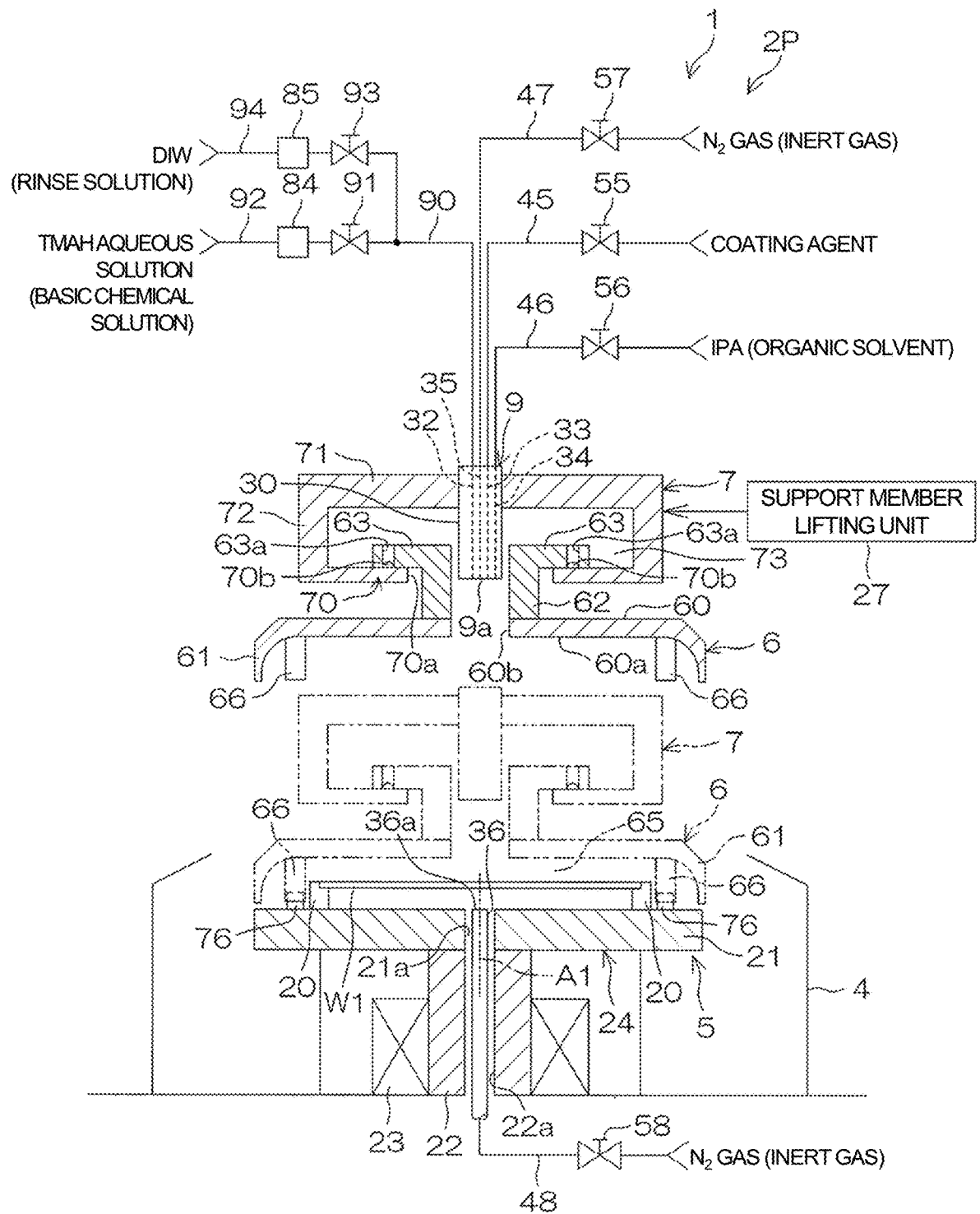
FIG. 12 is a schematic view of a processing unit provided in a substrate processing apparatus according to a second embodiment of the present disclosure.
Figure 13:
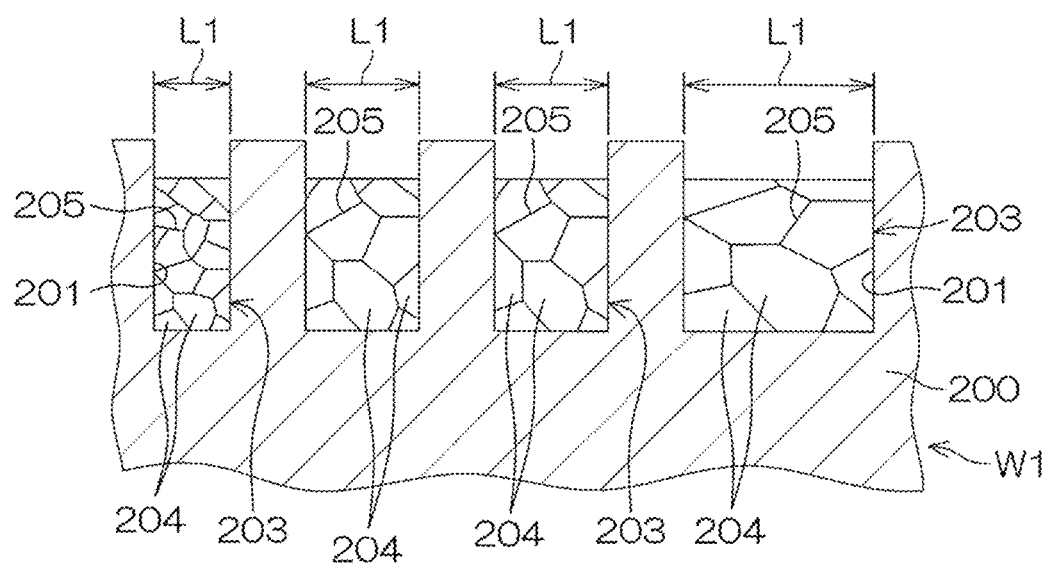
FIG. 13 is a cross-sectional view of the vicinity of a surface layer of a substrate processed by the substrate processing apparatus according to the second embodiment.

FIG. 12 is a schematic diagram of a processing unit 2P according to a second embodiment. FIG. 13 is a cross-sectional view of the vicinity of a surface layer of a substrate processed by a substrate processing apparatus 1 according to the second embodiment. In FIGS. 12 and 13 and FIGS. 14 and 15 which will be described later, the components equivalent to those shown in FIGS. 1 to 11 are designated by the same reference numerals as those in FIG. 1 and the like, and description thereof will be omitted.

The main difference between the processing unit 2P according to the second embodiment and the processing unit 2 (refer to FIG. 3) according to the first embodiment is that a substrate W1 in which the processing target layer is a polysilicon layer 203 (refer to FIG. 13) is used and that the etching solution is a basic chemical solution.

Specifically, the substrate W1 includes a semiconductor layer 200 in which a plurality of trenches 201 (the recessed parts) is formed in the vicinity of the surface layer, and the polysilicon layer 203 formed in each of the trenches 201 in a manner of a surface thereof is exposed.

Each of the trenches 201 has a line shape, for example. A width L1 of the line-shaped trench 201 is a size of the trench 201 in a direction orthogonal to a direction in which the trench 201 extends and a thickness direction of the substrate W1. All the widths L1 of the plurality of trenches 201 are not the same, and at least two types of trenches 201 having the widths L1 are formed in the vicinity of the surface layer of the substrate W. The width L1 is also a width of the polysilicon layer 203.

The polysilicon layer 203 is formed in each of the trenches 201 by a technique such as CVD. The polysilicon layer 203 is composed of a plurality of crystal grains 204. A distance between silicon atoms in a crystal grain boundary 205 is wider than that between silicon atoms in the crystal grain 204. Therefore, a gap in which an etching solution such as a basic chemical solution described later can enter is present between the silicon atoms in the crystal grain boundary 205. The gap between the silicon atoms in the crystal grain boundary 205 is, for example, 2 Å to 5 Å.

Similar to the first embodiment, the crystal grain boundary 205 is a kind of lattice defect and is formed by disorder of atomic arrangement. A dimension of the gap between the silicon atoms in the crystal grain boundary 205 is also a dimension of the lattice defect in the crystal grain boundary 205.

When a polysilicon crystal is grown in the trench 201 formed in a surface of the substrate, a size of the crystal grain 204 formed in the trench 201 changes according to the width L1 of the trench 201. Specifically, as the width L1 of the trench 201 becomes narrower, the crystal grains 204 are less likely to grow. As the width L1 of the trench 201 becomes wider, the crystal grains 204 are easier to grow. Therefore, as the width L1 of the trench 201 becomes narrower, it is likely to make a small crystal grain 204, and as the width L1 of the trench 201 becomes wider, it is likely to make a large crystal grain 204. That is, a density of the crystal grain boundary 205 is higher as the width L1 of the trench 201 is narrower, and the density of the crystal grain boundary 205 is lower as the width L1 of the trench 201 is wider.

Referring to FIG. 12, the central nozzle 9 of the processing unit 2 is not configured to discharge the oxidizing fluid but is configured to supply a basic chemical solution instead of discharging the acidic chemical solution. The central nozzle 9 does not include the first tube 31, and the second tube 32 supplies a basic chemical solution such as a tetramethylammonium hydroxide (TMAH) aqueous solution to the upper surface of the substrate W1. The second tube 32 serves as a basic chemical solution supply unit. The basic chemical solution discharged from the second tube 32 is an example of the etching solution. That is, the second tube 32 is also an example of the etching solution supply unit.

In the second embodiment, the second tube 32 is connected to a common pipe 90 through which both the basic chemical solution and the rinse solution pass. The common pipe 90 is branched into a basic chemical solution pipe 92 in which a basic chemical solution valve 91 is interposed, and a rinse solution pipe 94 in which a rinse solution valve 93 is interposed. A degassing unit 84 which degasses the basic chemical solution is interposed in the basic chemical solution pipe 92. A degassing unit 85 which degasses the rinse solution is interposed in the rinse solution pipe 94.

When the basic chemical solution valve 91 is opened, the degassed basic chemical solution is supplied to the second tube 32 via the basic chemical solution pipe 92 and the common pipe 90. The basic chemical solution is degassed by the degassing unit 84 and is continuously discharged downward from the discharge port of the second tube 32 (the discharge port 9a of the central nozzle 9).

When the rinse solution valve 93 is opened, the rinse solution is supplied to the second tube 32 via the rinse solution pipe 94 and the common pipe 90. The rinse solution is degassed by the degassing unit 85 and is continuously discharged downward from the discharge port of the second tube 32. That is, the fluid supplied from the second tube 32 is switched to any one of the basic chemical solution and the rinse solution by controlling the basic chemical solution valve 91 and the rinse solution valve 93.

When the TMAH aqueous solution is used as the basic chemical solution discharged from the second tube 32, an etching rate for the polysilicon layer 203 is constant regardless of the density of the crystal grain boundary 205. Specifically, when the TMAH aqueous solution is used as the basic chemical solution discharged from the second tube 32, the etching rate of the crystal grain and the etching rate of the crystal grain boundary become equal. Even when a trimethyl-2hydroxyethylammonium hydroxide (TMY) aqueous solution is used as the basic chemical solution, the etching rate of the crystal grain and the etching rate of the crystal grain boundary are equal.

The etching rate for the polysilicon layer 203 does not need to be completely constant regardless of the density of the crystal grain boundary 205 and may be substantially constant regardless of the density of the crystal grain boundary 205. That is, the etching rate may vary according to the density of the crystal grain boundary 205 as long as the semiconductor element using the substrate W1 processed by the substrate processing apparatus 1 according to the embodiment functions normally.

Similarly, the etching rate of the crystal grain and the etching rate of the crystal grain boundary do not need to be completely coincident with each other, and both etching rates may be substantially equal. The fact that the etching rate of the crystal grain and the etching rate of the crystal grain boundary are substantially equal means that the etching rate of the crystal grain and the etching rate of the crystal grain boundary are equal so that the semiconductor element using the substrate W1 processed by the substrate processing apparatus 1 according to the embodiment functions normally.

It is preferable that the basic chemical solution discharged from the second tube 32 mainly contain a compound having a size larger than the gap present in the crystal grain boundary 205 as a reaction compound which reacts with the silicon atoms 208 when the polysilicon layer 203 is etched. To this end, the basic chemical solution discharged from the second tube 32 is preferably the TMAH aqueous solution but is not limited thereto. That is, the basic chemical solution discharged from the second tube 32 may be an aqueous solution containing an organic alkali other than the TMAH aqueous solution.

The "reaction compound size" is the total (ion pair) size of ions of the reaction compound and hydroxide ions paired in an aqueous solution when the basic chemical solution is the aqueous solution. That is, when the reaction compound is TMAH, the size of TMAH is the total (ion pair) size of TMAH ions and hydroxide ions which have been paired. When the reaction compound is TMY, the size of TMY is the total (ion pair) size of TMY ions and hydroxide ions which have been paired.

The total size of ammonium ions and hydroxide ions contained in the ammonia aqueous solution which is a kind of inorganic alkali is the same as or smaller than the gaps present in the crystal grain boundary 205. The size of TMAH and TMY is larger than the size of the ammonia and larger than the gap present in the crystal grain boundary 205. While a molecular size of the ammonia is about 2 Å, a molecular size of TMAH calculated from a molecular model is about 7 Å, and a molecular size of TMY is about 9 Å.

That is, the molecular size of ammonia is the same as or smaller than the gap (2 Å to 5 Å) between the silicon atoms in the crystal grain boundary 205. On the other hand, the molecular size of TMAH and the molecular size of TMY are larger than the gaps (2 Å to 5 Å) between the silicon atoms in the crystal grain boundary 205.

The total (ion pair) size of the TMAH ions and hydroxide ions which have been paired is considered to be larger than the size of the gap, and specifically, larger than 5 Å. The total (ion pair) size of the TMY ions and hydroxide ions which have been paired is also considered to be larger than the size of the gap, specifically, larger than 5 Å.

The organic alkali discharged from the second tube 32 may be, for example, an aqueous solution containing at least one of TMAH and TMY. The second tube 32 is also an organic alkali supply unit. The basic chemical solution need not be an organic alkali aqueous solution and may be a melt of an organic alkali.

When the basic chemical solution discharged from the second tube 32 mainly contains the compound having the size larger than the gap present in the crystal grain boundary 205 as the reaction compound, a compound (for example, ammonia) having a size which is the same as or smaller than the gap present in the crystal grain boundary 205 may be contained as the reaction compound.

The rinse solution discharged from the second tube 32 is not limited to DIW and may be carbonated water, electrolytic ion water, hydrochloric acid water having a diluted concentration (for example, about 1 ppm to 100 ppm), diluted ammonia water having a diluted concentration (for example, about 1 ppm to 100 ppm), or reduced water (hydrogen water). The rinse solution discharged from the second tube 32 is preferably degassed.

Figure 14:
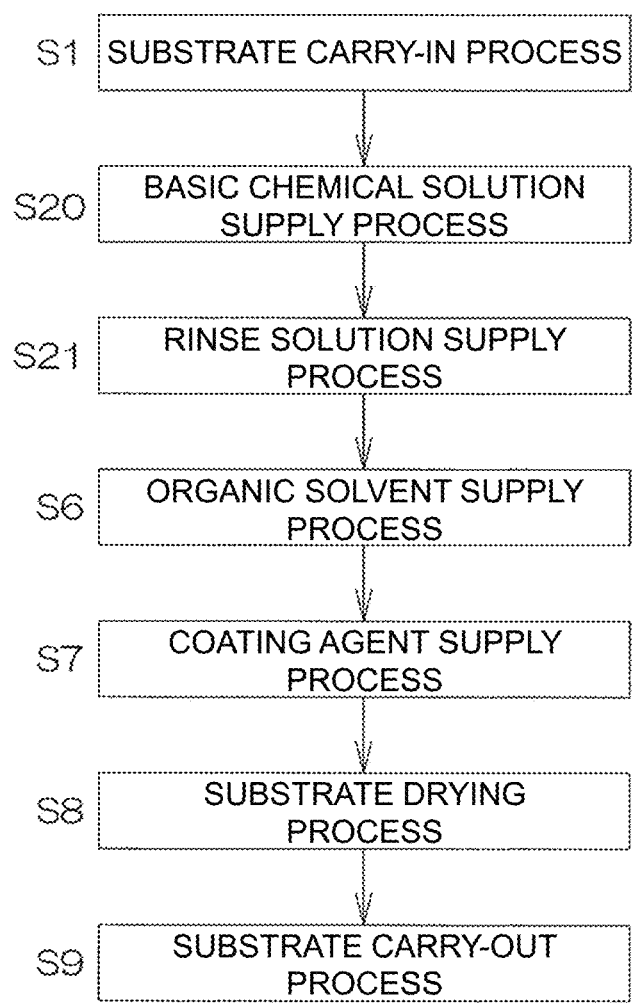
FIG. 14 is a flowchart for explaining an example of the substrate processing by the substrate processing apparatus according to the second embodiment.
Figure 15:
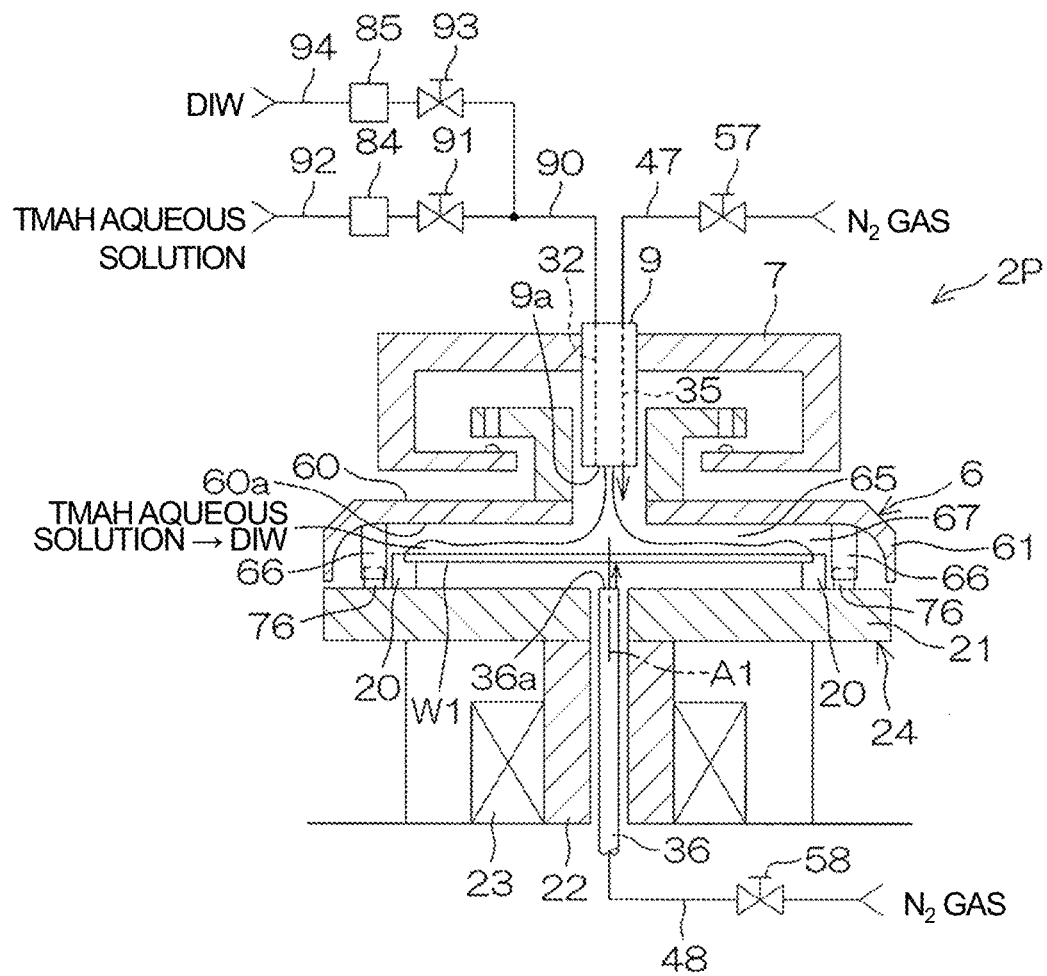
FIG. 15 is an illustrative cross-sectional view showing an example of substrate processing by the substrate processing apparatus according to the second embodiment.

FIG. 14 is a flowchart for explaining an example of the substrate processing by the substrate processing apparatus 1 according to the second embodiment. FIG. 15 is an illustrative cross-sectional view showing the substrate processing by the substrate processing apparatus 1 according to the second embodiment.

In the substrate processing apparatus 1 according to the second embodiment, for example, as shown in FIG. 14, a substrate carry-in process (Step S1), a basic chemical solution supply process (Step S20), a rinse solution supply process (Step S21), an organic solvent supply process (Step S6), a coating agent supply process (Step S7), a substrate drying process (Step S8), and a substrate carry-out process (Step S9) are performed in this order. In the substrate processing, each of the processes is not repeated but performed once.

Specifically, the substrate W1 having the upper surface in which the plurality of trenches 201 is formed is prepared (a substrate preparation process). Then, after the substrate W1 is carried into the processing unit 2 and held by the substrate holding unit 24, the facing member 6 and the substrate holding unit 24 are engaged by a magnetic force. Then, the substrate W1 is rotated around the rotational axis A1 by the spin motor 23 rotating the spin base 21. Then, the space 65 between the upper surface of the substrate W1 and the facing surface 60a of the facing part 60 is filled with an inert gas. The basic chemical solution valve 91 is opened in a state in which the space 65 between the upper surface of the substrate W1 and the facing surface 60a of the facing part 60 is filled with an inert gas. Accordingly, as shown in FIG. 15, the basic chemical solution such as a TMAH aqueous solution is supplied (discharged) from the second tube 32 of the central nozzle 9 toward the central region of the upper surface of the substrate W1 (a basic chemical solution supply process, a basic chemical solution discharge process).

The basic chemical solution supplied to the upper surface of the substrate W1 spreads evenly over the entire upper surface of the substrate W1 by a centrifugal force. The basic chemical solution on the substrate W1 is scattered radially outward from the substrate W1 by the centrifugal force and is received by the processing cup 4.

The etching of the polysilicon layer 203 is performed by supplying the basic chemical solution to the upper surface of the substrate W1, and at least a part of the polysilicon layer 203 is removed (a polysilicon layer removing process, a processing target layer removing process). In the processing target layer removing process, at least a part of the polysilicon layer 203 in all the trenches 201 is removed by etching.

Next, the rinse solution supply process (Step S21) is performed. After the supply of the basic chemical solution to the upper surface of the substrate W1 is continued for a predetermined time (for example, 10 seconds), the basic chemical solution valve 91 is closed. On the other hand, the rinse solution valve 93 is opened. Thus, as shown in FIG. 15, the rinse solution such as DIW is supplied (discharged) from the second tube 32 toward the central region of the upper surface of the substrate W1 (a rinse solution supply process, a rinse solution discharge process). That is, the fluid supplied to the upper surface of the substrate W1 is switched from the TMAH aqueous solution to DIW (TMAH aqueous solution→DIW).

The rinse solution discharged from the second tube 32 is a rinse solution degassed by the degassing unit 85 (a degassed rinse solution supply process). When the rinse solution is discharged from the second tube 32, the atmosphere in the accommodation space 67 (the space 65) has already been replaced by the inert gas. That is, the rinse solution is supplied to the upper surface of the substrate W1 while maintaining the dissolved oxygen concentration when degassed.

Thereafter, similarly to the substrate processing shown in FIG. 5, the organic solvent supply process (Step S6) to the substrate carry-out process (Step S9) are performed.

Referring to the brackets in FIGS. 8A and 8B, according to the second embodiment, the basic chemical solution is a TMAH aqueous solution containing TMAH having a size larger than a gap 206 present in the crystal grain boundary 205 as the reaction compound. Therefore, as in the first embodiment, an ion pair 209A in which TMAH ions 209 and hydroxide ions are paired is unlikely to enter between the silicon atoms 208 in the crystal grain boundary 205. That is, it is difficult for the reaction compound to enter the gap 206. Therefore, the etching proceeds to the same extent in both the crystal grain 204 and the crystal grain boundary 205. That is, when the basic chemical solution mainly contains an organic alkali such as TMAH as the reaction compound, the etching rate is substantially constant regardless of the density of the crystal grain boundary. In other words, when the basic chemical solution mainly contains an organic alkali such as TMAH as the reaction compound, the etching rate of the crystal grain and the etching rate of the crystal grain boundary are substantially equal.

Thus, when the basic chemical solution mainly contains an organic alkali such as TMAH as the reaction compound, the polysilicon layer 203 can be uniformly etched and removed from the trenches 201 regardless of the density of the crystal grain boundary of the polysilicon layer 203. That is, even when the plurality of trenches 201 having different widths L1 is present in the upper surface of the substrate W1, the polysilicon layer 203 can be uniformly removed from the plurality of trenches 201. As a result, the polysilicon layer 203 can be removed from the upper surface of the substrate W1 without variation.

In general, organic alkali molecules are larger in size than inorganic alkali molecules because many of the organic alkali molecules are composed of many atoms as compared with the inorganic alkali molecules. Therefore, when a solution containing the organic alkali is used as the basic chemical solution, the polysilicon layer 203 can be uniformly etched and removed from the trenches 201 regardless of the sparseness and denseness of the crystal grain boundary 205. Thus, even when the plurality of trenches 201 having different widths L1 is present in the upper surface of the substrate W1, the polysilicon layer 203 can be more uniformly removed from the trenches 201. As a result, the polysilicon layer 203 can be removed from the upper surface of the substrate W1 without variation.

Third Embodiment

Figure 16:
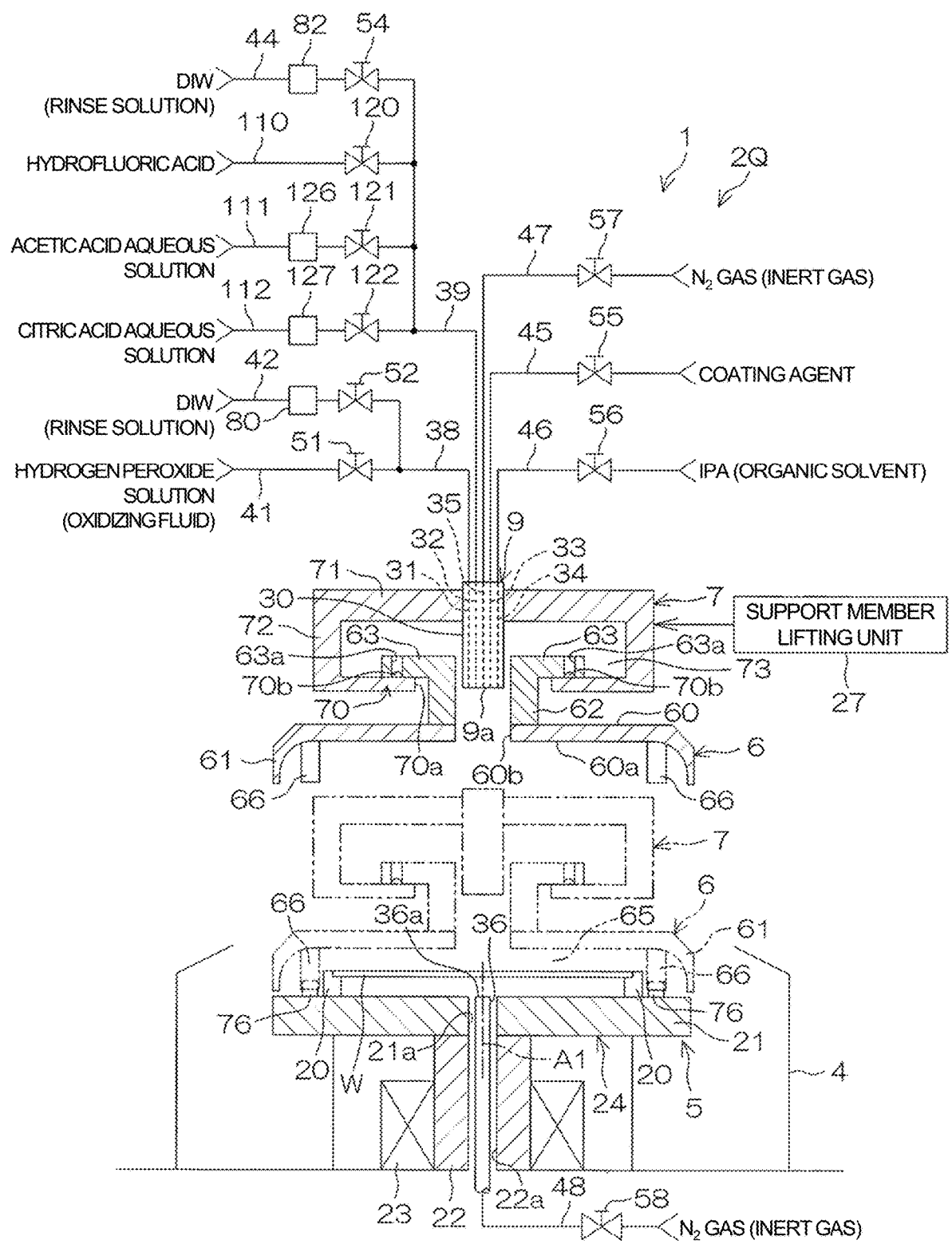
FIG. 16 is a schematic view of a processing unit provided in a substrate processing apparatus according to a third embodiment of the present disclosure.

FIG. 16 is a schematic diagram of a processing unit 2Q provided in the substrate processing apparatus 1 according to a third embodiment. In FIG. 16, the components equivalent to those shown in FIGS. 1 to 15 are designated by the same reference numerals as those in FIG. 1 and the like and description thereof will be omitted.

The main difference between the processing unit 2Q according to the third embodiment and the processing unit 2 according to the first embodiment (refer to FIG. 3) is that the type of the acidic chemical solution supplied to the upper surface of the substrate W can be switched.

Specifically, a hydrofluoric acid pipe 110, an acetic acid aqueous solution pipe 111, a citric acid aqueous solution pipe 112 and a second rinse solution pipe 44 are branched and connected to the second common pipe 39 connected to the second tube 32 of the central nozzle 9 of the processing unit 2Q. A hydrofluoric acid valve 120 is interposed in the hydrofluoric acid pipe 110. An acetic acid aqueous solution valve 121 and a degassing unit 126 are interposed in the acetic acid aqueous solution pipe 111. A citric acid aqueous solution valve 122 and a degassing unit 127 are interposed in the citric acid aqueous solution pipe 112. The hydrofluoric acid valve 120, the acetic acid aqueous solution valve 121, and the citric acid aqueous solution valve 122 are controlled by the controller 3 (refer to FIG. 4).

When the hydrofluoric acid valve 120 is opened, a hydrofluoric acid is supplied to the second tube 32 via the hydrofluoric acid pipe 110 and the second common pipe 39. When the acetic acid aqueous solution valve 121 is opened, an acetic acid aqueous solution is supplied to the second tube 32 via the acetic acid aqueous solution pipe 111 and the second common pipe 39. When the citric acid aqueous solution valve 122 is opened, a citric acid aqueous solution is supplied to the second tube 32 via the citric acid aqueous solution pipe 112 and the second common pipe 39.

The substrate processing apparatus 1 according to the third embodiment can perform the same substrate processing as that in the substrate processing apparatus 1 according to the first embodiment. In the substrate processing according to the third embodiment, in the acidic chemical solution supply process (Step S4 in FIG. 5), an acidic chemical solution type selection process (an etching solution selection process) in which the type of the acidic chemical solution supplied to the upper surface of the substrate W is selected from a plurality of solution types so that the etching rate of the crystal grain and the etching rate of the crystal grain boundary are equal.

In the acidic chemical solution type selection process, specifically, the type of the acidic chemical solution discharged from the second tube 32 is selected according to the widths L of the plurality of trenches 101 so that, as an average of the widths L of the trenches 101 in the entire upper surface of the substrate W used for the substrate processing becomes smaller, the size of the reaction compound contained in the acidic chemical solution supplied to the upper surface of the substrate W is larger.

According to the third embodiment, a type of the etching solution is selected so that the etching rate of the crystal grain and the etching rate of the crystal grain boundary are equal. Therefore, it is possible to select the type of the etching solution suitable for the substrate W in the processing target layer removing process.

Even when a basic chemical solution is used as the etching solution, a basic chemical solution type selection process can be performed when a plurality of types of basic chemical solutions can be supplied from the central nozzle 9. In the basic chemical solution type selection process, the type of the basic chemical solution supplied to the upper surface of the substrate W1 is selected to be discharged from the second tube 32 according to the widths L1 of the plurality of trenches 201 in the basic chemical solution supply process (Step S20 in FIG. 14) so that the etching rate of the crystal grain and the etching rate of the crystal grain boundary are equal.

Hereinafter, the results of experiments performed to demonstrate uniform etching of a substrate in which a plurality of trenches having different widths is formed in a surface thereof will be described with reference to FIGS. 17 to 21. In the following experiments, unless otherwise specified, a mass percent concentration of the hydrogen peroxide ($H_2O_2$) solution used as the oxidizing fluid is 3%, and a concentration of ozonized deionized water (D103) used as the oxidizing fluid is 7 ppm. Further, unless otherwise specified, a mass percent concentration of hydrofluoric acid (HF) used as the acidic chemical solution is 0.05%, and a mass percent concentration of the acetic acid aqueous solution (AA) and the citric acid aqueous solution (CA) used as the acidic chemical solution is 0.1%.

First, an experiment was performed to measure the etching amount after the cycle etching was performed on a substrate in which copper wirings were formed in trenches having different widths.

Specifically, an experiment for comparing a difference in the etching amount according to the type of the oxidizing fluid and an experiment for comparing a difference in the etching amount according to the type of the acidic chemical solution were performed. In each of the following experiments, a cross section of the substrate was observed using a scanning electron microscope (SEM) (SU-8000 manufactured by Hitachi High-Technologies) to measure the recess amount (the etching amount) of the copper wiring in each of the trenches (the same will be applied to the experiments related to FIGS. 22 and 23 described later.).

First, the experiment for comparing the difference in the etching amount according to the type of the oxidizing fluid will be described. Specifically, an experiment in which the etching amount is measured after the cycle etching is performed on the substrate using a hydrofluoric acid as the acidic chemical solution and a hydrogen peroxide solution as the oxidizing fluid, and an experiment in which the etching amount is measured after the cycle etching is performed on the substrate using a hydrofluoric acid as the acidic chemical solution and ozonized deionized water as the oxidizing fluid were performed.

In the cycle etching using the hydrogen peroxide solution, the substrate was processed with the hydrogen peroxide solution for 10 seconds in a room temperature environment and then was processed with the hydrofluoric acid for 10 seconds in a room temperature environment as one cycle, and this cycle was repeated 10 times. In the cycle etching using the hydrogen peroxide solution, the substrate was processed with the ozonized deionized water for 10 seconds in a room temperature environment and then was treated with the hydrofluoric acid for 10 seconds in a room temperature environment as one cycle, and this cycle was repeated 9 times.

Figure 17:
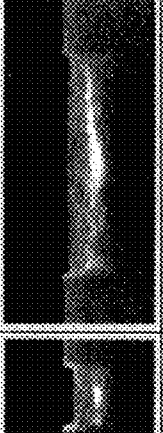
FIG. 17 is a diagram showing an SEM image of a cross section in the vicinity of the surface of the substrate, after oxidation of a copper wiring with the oxidizing fluid and etching of a copper oxide layer with the acidic chemical solution are repeated, for each type of the oxidizing fluid.
Figure 18:
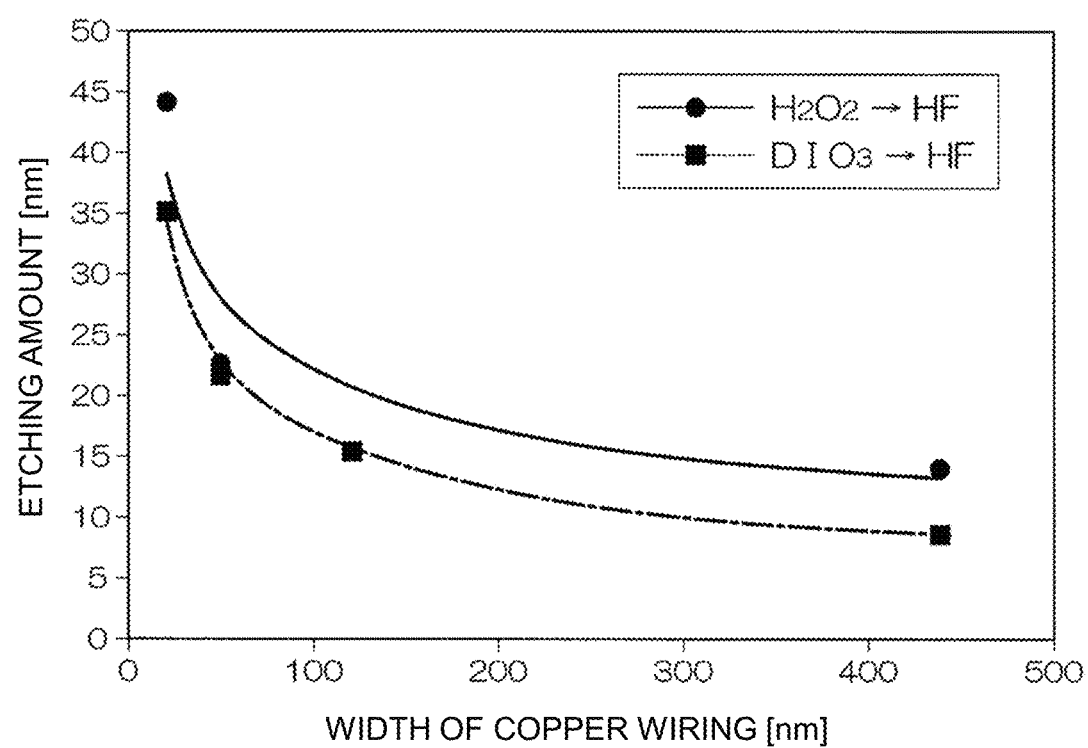
FIG. 18 is a graph showing a relationship between a width of the copper wiring and an etching amount obtained on the basis of the SEM image shown in FIG. 17 for each type of the oxidizing fluid.

FIG. 17 is a diagram showing an SEM image of a cross section in the vicinity of the surface of the substrate after the cycle etching for each type of the oxidizing fluid. FIG. 18 is a graph showing a relationship between the width of the copper wiring and the etching amount after the cycle etching for each type of the oxidizing fluid.

In FIGS. 17 and 18, the cycle etching using a hydrogen peroxide solution and a hydrofluoric acid is indicated by "$H_2O_2{\to}HF$", and the cycle etching using ozonized deionized water and a hydrofluoric acid is indicated by "$DIO_3{\to}HF$".

As shown in FIG. 18, regardless of which oxidizing fluid was used, the etching amount increased as the copper wiring width was narrowed. Further, there was no difference in the dependency of the etching amount on the width of the copper wiring according to the type of the oxidizing fluid. This result is considered to be based on the fact that a size of hydrogen peroxide ($H_2O_2$) contained in the hydrogen peroxide solution is substantially the same as that of ozone ($O_3$) contained in the ozonized deionized water. That is, since the size of the reaction compound in both the oxidizing fluids is substantially the same, a penetration of the hydrogen peroxide into the crystal grain boundary and a penetration of the ozone into the crystal grain boundary are substantially the same, and thus even when any oxidizing fluids are used, it is presumed that the etching amount increases as the width of the trench (the width of the copper wiring) is narrower.

Next, the experiment for comparing the difference in the etching amount according to the type of the acidic chemical solution will be described. Specifically, an experiment in which the etching amount is measured after the cyclic etching on the substrate is performed using a hydrofluoric acid as the acidic chemical solution and a hydrogen peroxide solution as the oxidizing fluid, an experiment in which the etching amount is measured after the cycle etching on the substrate is performed using a citric acid aqueous solution as the acidic chemical solution and a hydrogen peroxide solution as the oxidizing fluid, and an experiment in which the etching amount is measured after the cyclic etching on the substrate is performed using an acetic acid aqueous solution as the acidic chemical solution and a hydrogen peroxide solution as the oxidizing fluid were performed.

In the cycle etching using the hydrofluoric acid, the substrate was processed with the hydrogen peroxide solution for 10 seconds in a room temperature environment and then was processed with the hydrofluoric acid for 10 seconds in a room temperature environment as one cycle, and this cycle was repeated 10 times. In the cycle etching using the citric acid aqueous solution, the substrate was processed with the hydrogen peroxide solution for 10 seconds in a room temperature environment and then was processed with the citric acid aqueous solution for 10 seconds in a room temperature environment as one cycle, and this cycle was repeated 5 times. In the cycle etching using the acetic acid aqueous solution, the substrate was processed with the hydrogen peroxide solution for 10 seconds in a room temperature environment and then was processed with the acetic acid aqueous solution for 10 seconds in a room temperature environment as one cycle, and this cycle was repeated 5 times.

Figure 19:
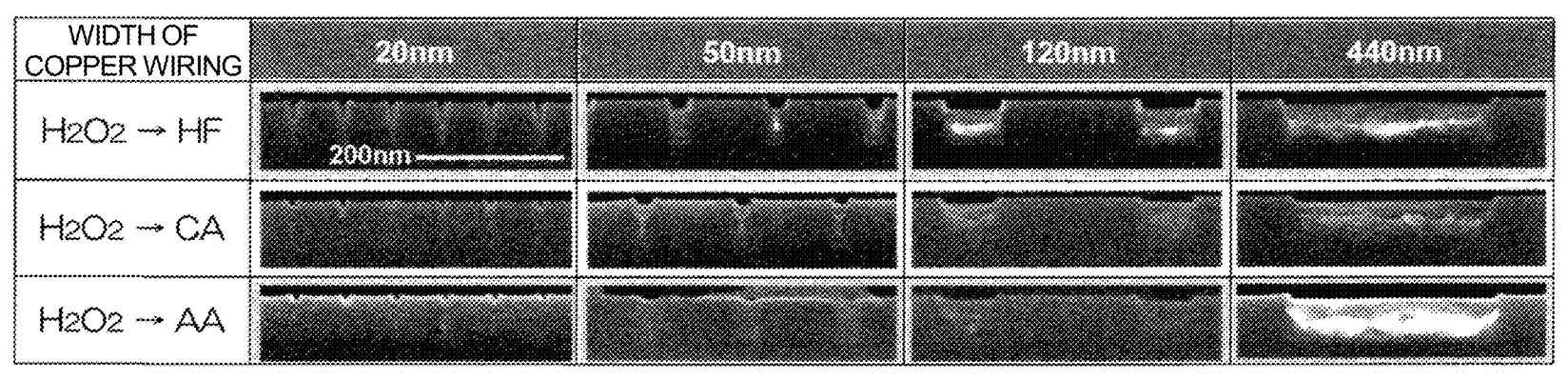
Figure 20:
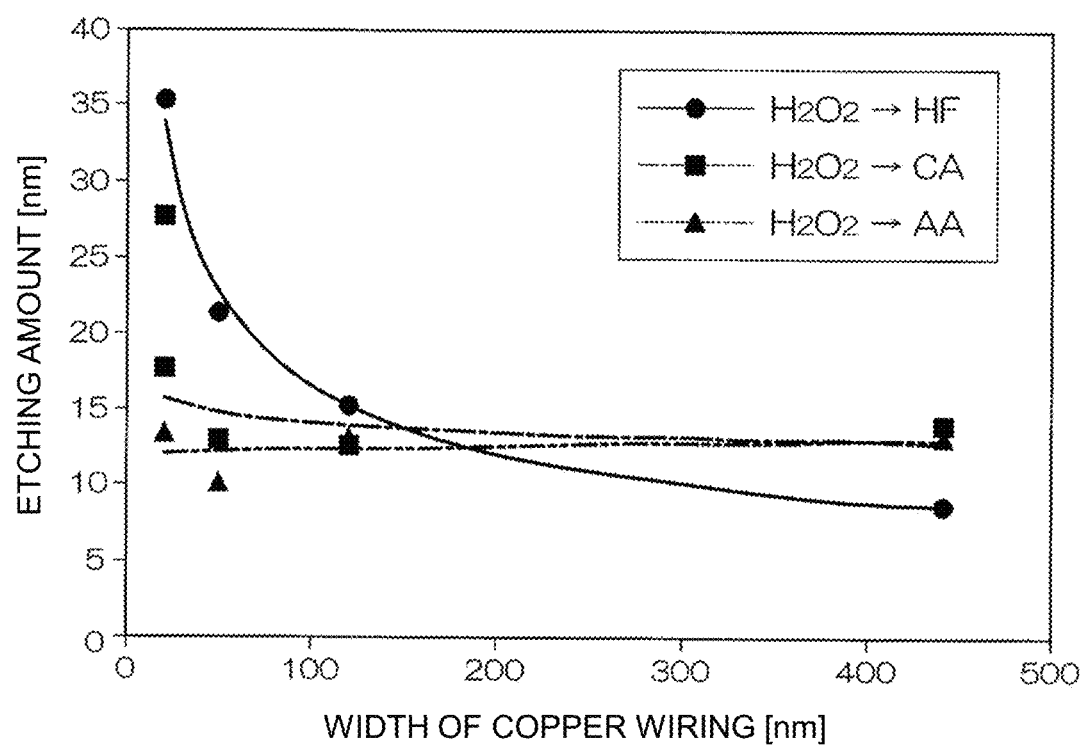
FIG. 20 is a graph showing a relationship between the width of the copper wiring and the etching amount obtained on the basis of FIG. 19 for each type of the acidic chemical solution.

FIG. 19 is a diagram showing a SEM image of a cross section in the vicinity of the surface of the substrate after the oxidation of the copper wiring with the oxidizing fluid and the etching of the copper oxide layer with the acidic chemical solution are repeated for each type of the acidic chemical solution. FIG. 20 is a graph showing a relationship between the width of the copper wiring and the etching amount by the cycle etching for each type of the acidic chemical solution.

In FIGS. 19 and 20, the cycle etching using the hydrogen peroxide solution and the hydrofluoric acid is indicated by "$H_2O_2{\to}HF$", and the cycle etching using the hydrogen peroxide solution and the citric acid aqueous solution is indicated by "$H_2O_2{\to}CA$". Further, the cycle etching using the hydrogen peroxide solution and the acetic acid aqueous solution is indicated by "$H_2O_2{\to}AA$".

As shown in FIGS. 19 and 20, when acidic chemical solution was used, the etching amount increased as the width of the copper wiring was narrower. On the other hand, when the acetic acid aqueous solution or the citric acid aqueous solution was used as the acidic chemical solution, the etching amount was substantially the same regardless of the width of the copper wiring.

Specifically, when the hydrofluoric acid was used as the acidic chemical, the etching amount tended to decrease as the width increased, the etching amount for the copper wiring having a width of 20 nm was 35 nm, and the etching amount for the copper wiring having a width of 440 nm was 10 nm. In this experiment, it can be calculated on the basis of 10 hydrofluoric acid treatments for 10 seconds that the maximum value of the etching rate is 0.35 nm/sec and the minimum value of the etching rate is 0.1 nm/sec.

Therefore, when the hydrofluoric acid was used as the acidic chemical solution, a ratio of the maximum value of the etching rate to the minimum value of the etching rate on the substrate surface was 3.5. Therefore, it was found that when the hydrofluoric acid was used as the acidic chemical solution, the etching rate of the crystal grain and the etching rate of the crystal grain boundary were different.

On the other hand, when the citric acid aqueous solution was used as the acidic chemical solution, the etching amount for the copper wiring having a width of 20 nm was 18 nm, the etching amount for the copper wiring having a width of 40 nm was 13 nm, the etching amount for the copper wiring having a width of 120 nm was 13 nm, and the etching amount for the copper wiring having a width of 440 nm was 15 nm. In this experiment, it can be calculated on the basis of the fact that the processing for 10 seconds with the citric acid aqueous solution is performed five times that the maximum value of the etching rate is 0.36 nm/sec and the minimum value of the etching rate is 0.26 nm/sec.

Therefore, when the citric acid aqueous solution was used as the acidic chemical solution, the ratio of the maximum value of the etching rate to the minimum value of the etching rate on the substrate surface was about 1.4. Therefore, it was found that when the citric acid aqueous solution was used as the acidic chemical solution, the etching rate of the crystal grain and the etching rate of the crystal grain boundary were substantially the same.

Even when the acetic acid aqueous solution was used as the acidic chemical solution, the same result as that obtained when the citric acid aqueous solution was used as the acidic chemical solution was obtained. Specifically, when the acetic acid aqueous solution was used as the acidic chemical solution, the etching amount for the copper wiring having a width of 20 nm was 13 nm, the etching amount for the copper wiring having a width of 40 nm was 10 nm, the etching amount for the copper wiring having a width of 120 nm was 13 nm, and the etching amount for the copper wiring having a width of 440 nm was 13 nm. In this experiment, it can be calculated on the basis of the fact that the processing for 10 seconds with the acetic acid aqueous solution is performed five times that the maximum value of the etching rate is 0.26 nm/sec and the minimum value of the etching rate is 0.20 nm/sec.

Therefore, when the acetic acid aqueous solution was used as the acidic chemical solution, the ratio of the maximum value of the etching rate to the minimum value of the etching rate on the substrate surface was 1.3. Therefore, it was found that when the acetic acid aqueous solution was used as the acidic chemical solution, the etching rate of the crystal grain and the etching rate of the crystal grain boundary were substantially the same.

These results are considered to be based on the fact that the size of the hydrogen fluoride (the size of ion pair formed by fluoride ions and hydrogen ions) is smaller than the size of the gap between copper atoms in the crystal grain boundary and the size of the acetic acid (the size of ion pair formed by acetate ions and hydrogen ions) or the size of the citric acid (the size of ion pair formed by citric acid ions and hydrogen ions) is larger than the size of the gap between copper atoms in the crystal grain boundary.

Specifically, since the ion pair formed by fluoride ions and hydrogen ions is smaller than the gap between copper atoms in the crystal grain boundary, it easily enters the crystal grain boundary. Therefore, it is presumed that the etching amount in the copper wiring having a width of 20 nm or 50 nm (the copper wiring having the high density of the crystal grain boundary) is larger than the etching amount in the copper wiring having a width of 120 nm or 440 nm (the copper wiring having the low density of the crystal grain boundary).

On the other hand, since the size of each of the acetic acid and the citric acid is larger than the gap between copper atoms in the crystal grain boundary, the ion pair formed by acetate ions and hydrogen ions or the ion pair formed by citric acid ions and hydrogen ions is difficult to enter the crystal grain boundary and the vicinity of the surface of the crystal grain is mainly etched. Therefore, when the acetic acid aqueous solution or the citric acid aqueous solution is used as the acidic chemical solution, it is presumed that the etching amount was substantially the same regardless of the width of the copper wiring.

Figure 21:
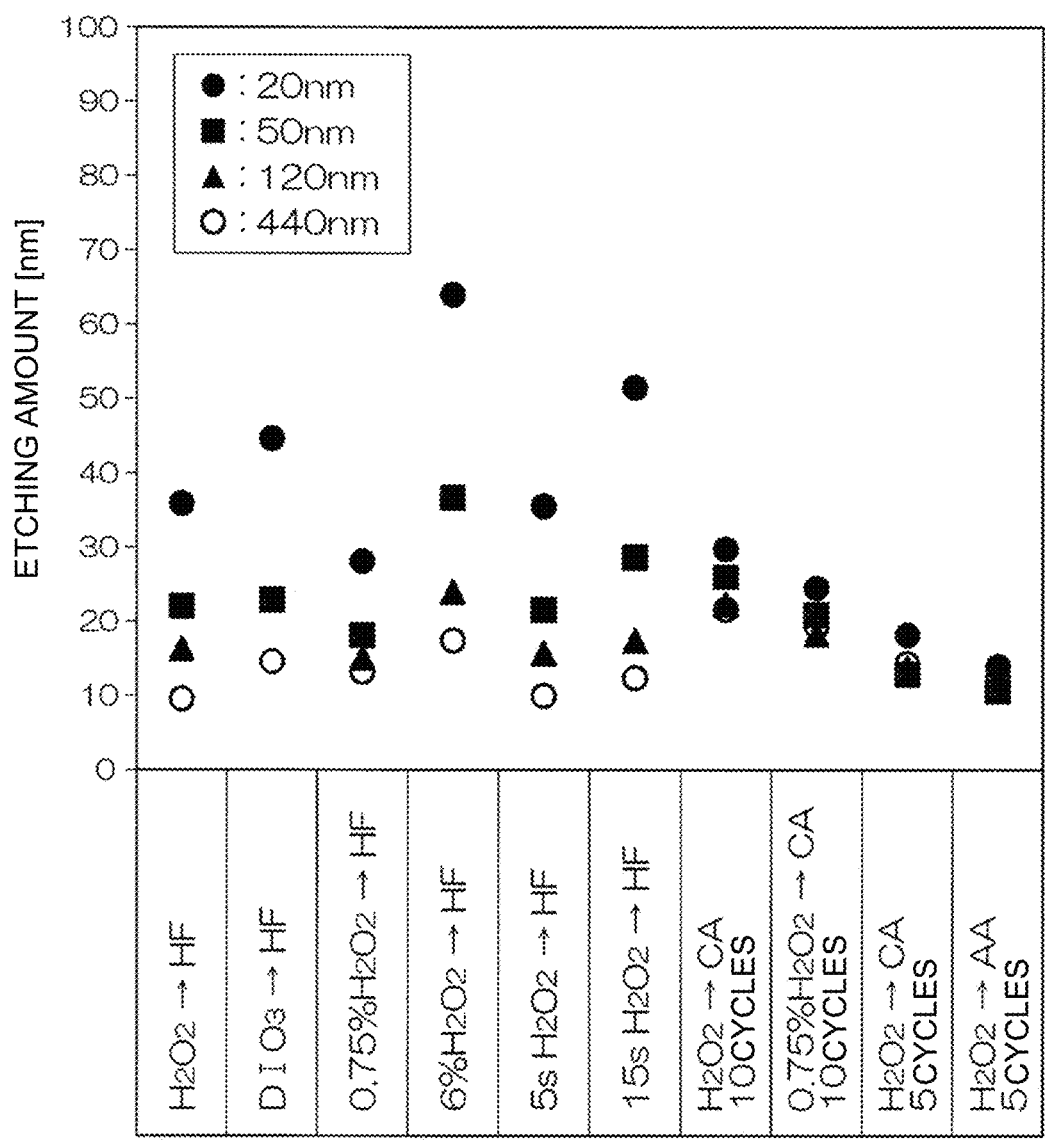
FIG. 21 is a graph showing the etching amount, after the oxidation of the copper wiring with the oxidizing fluid and the etching of the copper oxide layer with the acidic chemical solution are repeated, for each combination of the oxidizing fluid and the acidic chemical solution.

FIG. 21 is a graph showing the etching amount after the cycle etching for each combination of the oxidizing fluid and the acidic chemical solution. FIG. 21 shows results of the cycle etching under conditions different from those shown in FIGS. 17 to 20 in addition to the cycle etching under the conditions shown in FIGS. 17 to 20.

Specifically, FIG. 21 shows the etching amount when the mass percent concentration of the hydrogen peroxide solution is changed to 6% in the cycle etching using the hydrogen peroxide solution and the hydrofluoric acid (refer to "6% $H_2O_2 \rightarrow HF$"). Further, FIG. 21 shows the etching amount when the mass percent concentration of the hydrogen peroxide solution is changed to 0.75% in the cycle etching using the hydrogen peroxide solution and the hydrofluoric acid (refer to "0.75% $H_2O_2 \rightarrow HF$").

Further, FIG. 21 also shows the etching amount when a processing time with the hydrogen peroxide solution per cycle is changed to 5 seconds in the cycle etching using the hydrogen peroxide solution and the hydrofluoric acid ("5s$H_2O_2 \rightarrow HF$"). Furthermore, FIG. 21 also shows the etching amount when the processing time with the hydrogen peroxide solution per cycle is changed to 15 seconds in the cycle etching using the hydrogen peroxide solution and the hydrofluoric acid ("15s$H_2O_2 \rightarrow HF$").

In addition, FIG. 21 also shows the etching amount when the number of cycles is 10 in the cycle etching using the hydrogen peroxide solution and the citric acid aqueous solution ("$H_2O_2 \rightarrow CA$ 10 cycles"). Further, FIG. 21 shows the etching amount when the number of cycles is 10 and the hydrogen peroxide solution having a mass percent concentration of 0.75% is used in the cycle etching using the hydrogen peroxide solution and the citric acid aqueous solution ("0.75% $H_2O_2 \rightarrow CA$" 10 cycles).

As shown in FIG. 21, in the cyclic etching using the hydrofluoric acid as the acidic chemical solution, a result having a large difference between the etching amount of the copper wiring with a small width and the etching amount of the copper wiring with a large width was obtained under any conditions. On the other hand, in the cycle etching using the citric acid aqueous solution as the acidic chemical solution, a result in which the etching amount of the copper wiring having a small width and the etching amount of the copper wiring having a large width were substantially the same was obtained under any conditions.

Next, an experiment in which the etching amount is measured after the substrate in which the copper wirings were formed in the trenches having different widths is etched with a mixed solution of the oxidizing fluid and the acidic chemical solution was performed.

Specifically, experiments were performed to compare the difference in the etching amount according to the type of the acidic chemical solution. In the experiments, an experiment in which the etching amount is measured after the substrate is etched with a mixed solution of the hydrofluoric acid and the hydrogen peroxide solution, an experiment in which the etching amount is measured after the etching is performed with a mixed solution of the citric acid aqueous solution and the hydrogen peroxide solution, and an experiment in which the etching amount is measured after the etching is performed with a mixed solution of the acetic acid aqueous solution and the hydrogen peroxide solution were performed.

In the etching with the mixed solution of the hydrofluoric acid and the hydrogen peroxide solution, the substrate was processed for 10 seconds in a room temperature environment with a mixed solution in which the mass percent concentration of the hydrogen peroxide is 3% and the mass percent concentration of the hydrogen fluoride is 0.05%. In the etching with the mixed solution of the citric acid aqueous solution and the hydrogen peroxide solution, the substrate was processed for 20 seconds in a room temperature environment with a mixed solution in which the mass percent concentration of the hydrogen peroxide was 3% and the mass percent concentration of the citric acid was 0.05%. In the etching with the mixed solution of the acetic acid aqueous solution and the hydrogen peroxide solution, the substrate was processed for 20 seconds in a room temperature environment with a mixed solution in which the mass percent concentration of the hydrogen peroxide was 3% and the mass percent concentration of the acetic acid was 0.05%.

Figure 22:
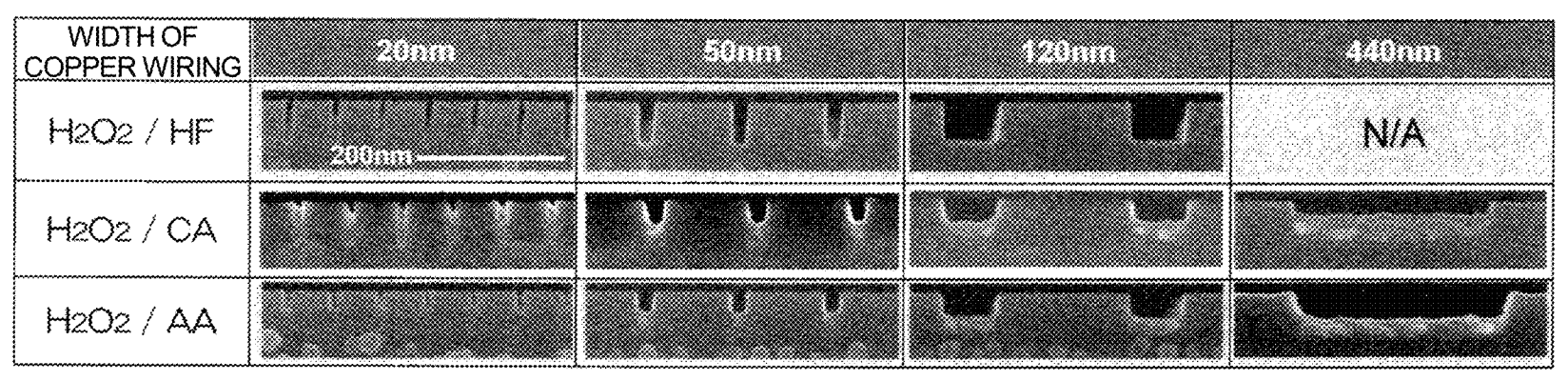
Figure 23:
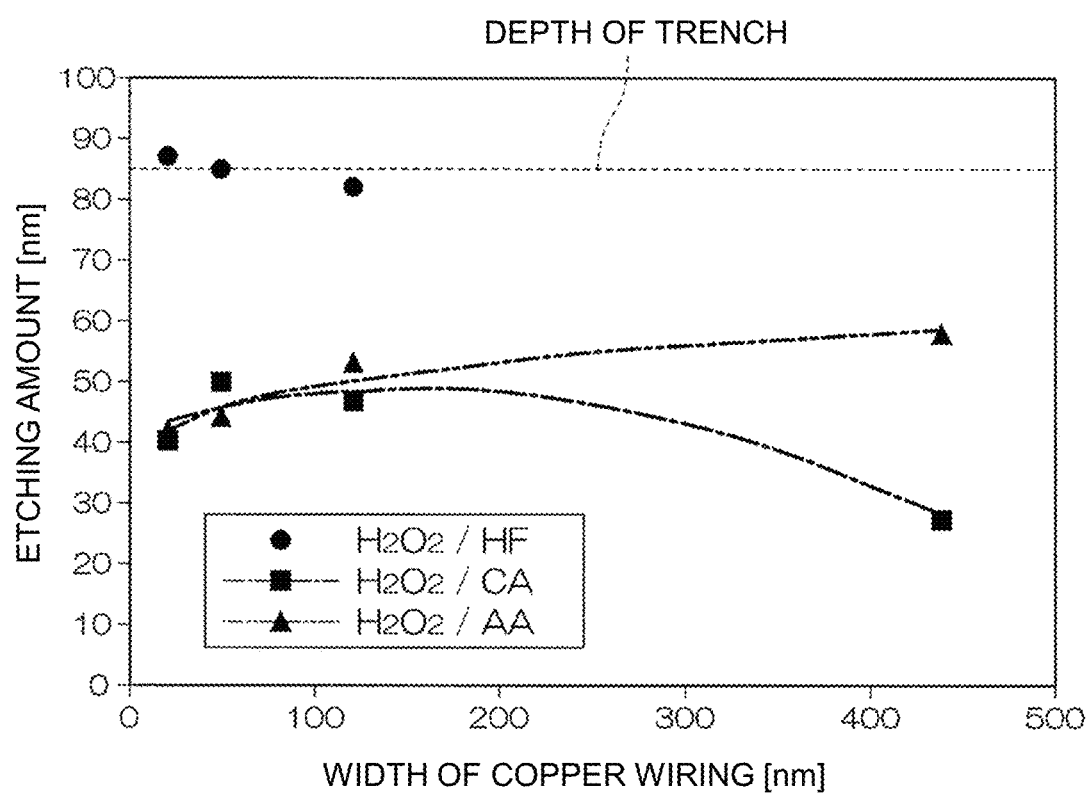
FIG. 23 is a graph showing a relationship between the width of the copper wiring and the etching amount obtained on the basis of FIG. 22 for each type of the acidic chemical solution.

FIG. 22 is a diagram showing a SEM image of a cross section in the vicinity of the surface of the substrate after the copper wiring is etched with a mixed solution of the oxidizing fluid and the acidic chemical solution for each type of the acidic chemical solution. FIG. 23 is a graph showing a relationship between the width of the copper wiring and the etching amount when the copper wiring is etched with a mixed solution of the oxidizing fluid and the acidic chemical solution for each type of the acidic chemical solution.

In FIGS. 22 and 23, the etching using the mixed solution of the hydrogen peroxide solution and the hydrofluoric acid is indicated by "$H_2O_2$/HF", and the etching using the mixed solution of the hydrogen peroxide solution and the citric acid aqueous solution is indicated by "$H_2O_2$/CA". Further, the etching using the mixed solution of the hydrogen peroxide solution and the acetic acid aqueous solution is indicated by "$H_2O_2$/AA".

As shown in FIGS. 22 and 23, in the etching using the mixed solution of the hydrofluoric acid and the hydrogen peroxide solution, the etching amount is about 80 nm to 85 nm which is substantially equal to a depth of the trench regardless of the width of the copper wiring. That is, it can be presumed that all the copper wiring in the trench has been removed regardless of the width of the copper wiring. Therefore, in the experiment in which the etching amount was measured after the substrate was etched with the mixed solution of the hydrofluoric acid and the hydrogen peroxide solution, uniformity of the etching amount with respect to the width of the copper wiring could not be evaluated.

On the other hand, in the etching with the mixed solution of the citric acid aqueous solution and the hydrogen peroxide solution, the etching amount for the copper wiring having a width of 20 nm was 40 nm, the etching amount for the copper wiring having a width of 40 nm was 50 nm, the etching amount for the copper wiring having a width of 120 nm was 45 nm, and the etching amount for the copper wiring having a width of 440 nm was 28 nm. It can be calculated on the basis of the fact that the processing with the mixed solution is performed for 10 seconds that the maximum value of the etching rate is 2.5 nm/sec and the minimum value of the etching rate is 1.4 nm/sec. Therefore, when the citric acid aqueous solution was used as the acidic chemical solution, the ratio of the maximum value of the etching rate to the minimum value of the etching rate on the surface of the substrate was about 1.8. Thus, it was found that the etching rate of the crystal grain and the etching rate of the crystal grain boundary were approximately the same in the etching with the mixed solution of the citric acid aqueous solution and the hydrogen peroxide solution.

Even when the acetic acid aqueous solution was used as the acidic chemical solution, the same result as that obtained when the citric acid aqueous solution was used as the acidic chemical solution was obtained. Specifically, when the acetic acid aqueous solution was used as the acidic chemical solution, the etching amount for the copper wiring having a width of 20 nm was 40 nm, the etching amount for the copper wiring having a width of 40 nm was 42 nm, the etching amount for the copper wiring having a width of 120 nm was 52 nm, and the etching amount for the copper wiring having a width of 440 nm was 60 nm. The maximum value of the etching rate was 3.0 nm/sec and the minimum value of the etching rate was 2.0 nm/sec on the basis of the fact that the processing with the mixed solution is performed for 10 seconds.

Therefore, when the acetic acid aqueous solution was used as the acidic chemical solution, the ratio of the maximum value of the etching rate to the minimum value of the etching rate on the surface of the substrate was about 1.5. It was found that the etching rate of the crystal grain and the etching rate of the crystal grain boundary are substantially the same in the etching with the mixed solution of the acetic acid aqueous solution and the hydrogen peroxide solution.

From these results, it is possible to consider the same as in the experiment which is described with reference to FIGS. 17 to 21 and in which the etching amount is measured after the cycle etching is performed on the substrate in which the copper wiring is formed in the trenches having different widths. That is, since the size of the acetic acid and the citric acid is larger than the gap between copper atoms in the crystal grain boundary, an ion pair formed by acetate ions and hydrogen ions and an ion pair formed by citrate ions and hydrogen ions are difficult to enter the crystal grain boundary, and the vicinity of the surface of the crystal grain is mainly etched. Thus, when the acetic acid aqueous solution or the citric acid aqueous solution is used as the acidic chemical solution, it is presumed that the etching amount was substantially the same regardless of the width of the copper wiring.

The present disclosure is not limited to the above-described embodiments and can be implemented in other forms.

For example, the substrate W may include a metal layer formed of a metal (for example, chromium or ruthenium) other than copper.

Further, in the above-described embodiments, the degassing units 81, 82, 84, 85, 126 and 127 interposed in the pipes (the first rinse solution pipe 42, the acidic chemical solution pipe 43, the second rinse solution pipe 44, the basic chemical solution pipe 92, the rinse solution pipe 94, the acetic acid aqueous solution pipe 111, the citric acid aqueous solution pipe 112) are used for degassing a solution. However, the solution degassed in advance may be supplied to the pipes.

In the above-described embodiment, the trenches 101 and 201 have a line shape. However, the trenches do not need to have a line shape and may have a shape having an opening part which is closed in a plan view. Specifically, the trenches may have a circular, elliptical, or polygonal shape in a plan view.

When the trench has such shapes, the width of the trench is the maximum dimension in a plan view. Specifically, when the trench has a circular shape in a plan view, the width of the trench is a diameter of the circular shape. When the trench has an elliptical shape in a plan view, the width of the trench is a major axis of the elliptical shape. When the trench has a quadrangular shape in a plan view, the width of the trench is a diagonal line of the quadrangular shape.

It will be apparent to those skilled in the art that various modifications and variations can be made to the disclosed embodiments without departing from the scope or spirit of the present disclosure. In view of the foregoing, it is intended that the present disclosure covers modifications and variations provided that they fall within the scope of the following claims and their equivalents.

What is claimed is:

1. A substrate processing method which processes a substrate having a surface in which a plurality of recessed parts is formed, the substrate processing method comprising:
    a processing target layer removing process, etching and removing at least a part of a processing target layer by supplying an etching solution, of which an etching rate for a crystal grain of a processing target material in the processing target layer formed in the recessed part in a manner of a surface of the processing target layer is exposed is equal to an etching rate for a crystal grain boundary in the processing target layer, to the surface of the substrate,
    wherein the etching solution contains an organic acid as a reaction compound which reacts with the processing target material when the processing target layer is etched,
    the organic acid has a size larger than a gap present in the crystal grain boundary.

2. The substrate processing method according to claim 1, wherein the organic acid comprising at least one of formic acid, acetic acid, hydroxy acid and ethylenediaminetetraacetic acid.

3. The substrate processing method according to claim 1, further comprising an etching solution type selection process, selecting a type of the etching solution supplied to the surface of the substrate in the processing target layer removing process from a plurality of types of etching solutions according to widths of the plurality of recessed parts so that the etching rate for the crystal grain is equal to the etching rate for the crystal grain boundary.

4. The substrate processing method according to claim 1, further comprising a processing target layer forming process, forming the processing target layer by supplying a denaturalization fluid on the surface of the substrate and denaturalizing a surface layer of a layer to be denaturalized which is formed in the recessed part in a manner of a surface of the layer to be denaturalized is exposed.

5. The substrate processing method according to claim 4, wherein supply of the etching solution to the surface of the substrate in the processing target layer removing process is performed in parallel with supply of the denaturalization fluid to the surface of the substrate in the processing target layer forming process.

6. The substrate processing method according to claim 4, wherein:
    the processing target layer forming process comprises a metal oxide layer forming process, forming a metal oxide layer as the processing target layer by oxidizing a surface layer of the metal layer as the layer to be denaturalized with an oxidizing fluid as the denaturalization fluid.

7. The substrate processing method according to claim 4, wherein supply of the etching solution to the surface of the substrate in the processing target layer removing process is started after supply of the denaturalization fluid to the surface of the substrate in the processing target layer forming process is stopped.

8. The substrate processing method according to claim 7, wherein:
    the processing target layer forming process comprises a process of forming the processing target layer composed of a single atomic layer or several atomic layers by denaturalizing a surface layer of the layer to be denaturalized, and
    the processing target layer removing process comprises a process of selectively removing the processing target layer from the surface of the substrate.

9. The substrate processing method according to claim 8, wherein the processing target layer forming process and the processing target layer removing process are alternately performed a plurality of times.

10. A substrate processing method which processes a substrate having a surface in which a plurality of recessed parts is formed, the substrate processing method comprising:
    a processing target layer removing process, etching and removing at least a part of a processing target layer by supplying an etching solution having a constant etching rate for the processing target layer to the surface of the substrate regardless of a density of a crystal grain boundary of a processing target material in the processing target layer formed in the recessed part in a manner of a surface of the processing target layer is exposed,
    wherein the etching solution contains an organic acid as a reaction compound which reacts with the processing target material when the processing target layer is etched,
    the organic acid has a size larger than a gap present in the crystal grain boundary.

11. The substrate processing method according to claim 10, wherein the organic acid comprising at least one of formic acid, acetic acid, hydroxy acid and ethylenediaminetetraacetic acid.

12. A substrate processing method which processes a substrate having a surface in which a plurality of recessed parts is formed, the substrate processing method comprising:
    a processing target layer removing process, etching and removing at least a part of a processing target layer by supplying an etching solution, of which an etching rate for a crystal grain of a processing target material in the processing target layer formed in the recessed part in a manner of a surface of the processing target layer is exposed is equal to an etching rate for a crystal grain boundary in the processing target layer, to the surface of the substrate, and
    a processing target layer forming process, forming the processing target layer by supplying a denaturalization fluid on the surface of the substrate and denaturalizing a surface layer of a layer to be denaturalized which is formed in the recessed part in a manner of a surface of the layer to be denaturalized is exposed.

13. A substrate processing method which processes a substrate having a surface in which a plurality of recessed parts is formed, the substrate processing method comprising:

a processing target layer removing process, etching and removing at least a part of a processing target layer by supplying an etching solution, of which an etching rate for a crystal grain of a processing target material in the processing target layer formed in the recessed part in a manner of a surface of the processing target layer is exposed is equal to an etching rate for a crystal grain boundary in the processing target layer, to the surface of the substrate, wherein the processing target layer removing process comprises a polysilicon layer removing process, removing a surface layer of a polysilicon layer as the processing target layer from the surface of the substrate by supplying a basic chemical solution as the etching solution.

14. The substrate processing method according to claim 13, wherein the basic chemical solution comprises an organic alkali.

15. A substrate processing method which processes a substrate having a surface in which a plurality of recessed parts is formed, the substrate processing method comprising:
a processing target layer removing process, etching and removing at least a part of a processing target layer by supplying an etching solution, of which an etching rate for a crystal grain of a processing target material in the processing target layer formed in the recessed part in a manner of a surface of the processing target layer is exposed is equal to an etching rate for a crystal grain boundary in the processing target layer, to the surface of the substrate, and
an etching solution type selection process, selecting a type of the etching solution supplied to the surface of the substrate in the processing target layer removing process from a plurality of types of etching solutions according to widths of the plurality of recessed parts so that the etching rate for the crystal grain is equal to the etching rate for the crystal grain boundary.

* * * * *